(12) United States Patent
Itai et al.

(10) Patent No.: US 7,250,227 B2
(45) Date of Patent: Jul. 31, 2007

(54) ORGANIC ELECTROLUMINESCENT ELEMENT, MATERIAL FOR POSITIVE HOLE INJECTING LAYER, AND ORGANIC ELECTROLUMINESCENT DISPLAY

(75) Inventors: Yuichiro Itai, Kawasaki (JP); Takashi Iida, Kawasaki (JP); Jun Kodama, Kawasaki (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/192,353

(22) Filed: Jul. 29, 2005

(65) Prior Publication Data

US 2006/0008675 A1    Jan. 12, 2006

Related U.S. Application Data

(63) Continuation of application No. PCT/JP03/00887, filed on Jan. 30, 2003.

(51) Int. Cl.
*H01L 51/50* (2006.01)
(52) U.S. Cl. .................. 428/690; 428/917; 313/504; 313/506
(58) Field of Classification Search ............... 428/690, 428/917, 414; 313/504, 506; 257/40, 88, 257/103, E51.033; 528/401; 568/677
See application file for complete search history.

(56) References Cited

U.S. PATENT DOCUMENTS 6,208,077 B1    3/2001   Hung
6,896,723 B2 *  5/2005   Irvin et al. ............... 106/31.43

FOREIGN PATENT DOCUMENTS

| JP | 5-32596 | 2/1993 |
|---|---|---|
| JP | 5-190283 | 7/1993 |
| JP | 5-194943 | 8/1993 |
| JP | 5-222361 | 8/1993 |

(Continued)

OTHER PUBLICATIONS

JPO abstract and computer generated translation of JP 200-056980 published Feb. 2002.*

(Continued)

*Primary Examiner*—Dawn L. Garrett
(74) *Attorney, Agent, or Firm*—Birch, Stewart, Kolasch & Birch, LLP

(57) ABSTRACT

The present invention relates to highly reliable organic EL elements that can provide higher luminance with lower voltage and exhibit lower leak current at negative biases and appropriate diode properties. The organic EL element comprises a positive hole injecting layer, and a perfluoropolyether compound is incorporated into the positive hole injecting layer. Preferably, the perfluoropolyether compound is expressed by formula (1) or (2), $$R^1—Rf—R^2 \qquad \text{formula (1)}$$

$$Rf—R^3 \qquad \text{formula (2)}$$

in which, $R^1$, $R^2$, and $R^3$ represents one of a hydrogen atom, a fluorine atom, and a substituted group; Rf represents the perfluoropolyether skeleton expressed by the formula (3), $$\left[\begin{array}{c} R^4 \\ | \\ CF—C_nF_{2n}—O \end{array}\right]_x \left[\begin{array}{c} R^5 \\ | \\ CF—C_mF_{2m}—O \end{array}\right]_y \quad \text{formula (3)}$$

in which, $R^4$ and $R^5$ represent general formula $—C_pF_{2p+1}$; n, m, x, and y are each an integer.

11 Claims, 10 Drawing Sheets

FOREIGN PATENT DOCUMENTS

| | | |
|---|---|---|
| JP | 5-326146 | 12/1993 |
| JP | 7-110940 | 4/1995 |
| JP | 8-259940 | 10/1996 |
| JP | 9-90640 | 4/1997 |
| JP | 10-289786 | 10/1998 |
| JP | 11-87057 | 3/1999 |
| JP | 11-219790 | 8/1999 |
| JP | 11-273864 | 10/1999 |
| JP | 2000-26337 | 1/2000 |
| JP | 2000-30867 | 1/2000 |
| JP | 2001-102172 | 4/2001 |
| JP | 2001-118682 | 4/2001 |
| JP | 2002-56980 | 2/2002 |
| JP | 2002-216956 | 8/2002 |
| JP | 2002-313565 | 10/2002 |

OTHER PUBLICATIONS

C.W. Tang, et al., "Organic electroluminescent diodes", Applied Physics Letters, vol. 51,913, Jun. 9, 1987.

C. W. Tang, et al., "Electroluminescence of doped organic thin films", Journal of Applied Physics, vol. 65(9), pp. 3610-3616, May 10, 1989.

* cited by examiner

ORGANIC ELECTROLUMINESCENT ELEMENT, MATERIAL FOR POSITIVE HOLE INJECTING LAYER, AND ORGANIC ELECTROLUMINESCENT DISPLAY

CROSS-REFERENCE TO RELATED APPLICATIONS

This is a continuation of Application PCT/JP2003/000887, filed on Jan. 30, 2003.

BACKGROUND OF THE INVENTION

1. Field of the Invention

The present invention relates to positive hole injecting materials that can increase the amount of injected positive holes; highly reliable organic electroluminescent (EL) elements that can provide higher luminance with lower voltage and exhibit lower leak currents at negative biases; and higher performance organic EL displays that utilize the organic EL elements.

2. Description of the Related Art

Organic EL elements have features such as self-luminousness and rapid response, and are expected to apply to flat panel displays. Such organic EL elements are attracting worldwide interests in terms of larger area elements that are capable of emitting light at lower voltages such as 10 V or less, since two-layer type or laminated type organic EL elements were announced that were prepared by laminating an organic thin layer or positive hole transporting layer and an organic thin layer or an electron transporting layer (see "C. W. Tang and S. A. VanSlyke, Applied Physics Letters vol. 51, 913 (1987)", for example). The organic EL elements of the laminated type typically have a basic construction of positive electrode/positive hole transporting layer/light emitting layer/electron transporting layer/negative electrode; in addition, the function of the light emitting layer may be combined to the positive hole transporting layer or electron transporting layer as in the two-layer type.

Conventionally, positive electrodes in organic EL elements have been formed from conductive transparent substance, typically from indium tin oxide (ITO). However, organic EL elements that are manufactured by forming a light emitting layer on a positive electrode formed of ITO etc. suffer from insufficient amount of injected positive holes and non-actuating at lower voltages.

Therefore, various trials have been made to actuate organic EL elements at lower voltages through oxidizing the surface of positive electrode by UV irradiation in oxygen gas or by oxygen plasma so as to increase the amount of injected positive holes. Further, a positive hole injecting layer formed from a copper phthalocyanine layer etc. was proposed to intervene between a positive hole transporting layer and a positive electrode to increase the amount of injected positive holes and to actuate the organic EL elements at lower voltages (see Japanese Patent Application Laid-Open (JP-A) No. 2000-30867). Further, a multi-layer electrode was proposed as a positive electrode of organic EL element that comprises a carbon fluoride layer and a conductive layer on a substrate in turn (see JP-A No. 11-219790).

However, these proposals suffer from some problems still in that the effect is not sufficient yet to increase the amount of injected positive holes; leak currents flow when negative voltages are applied; diode properties are not sufficient; reliability is not sufficient; and wettability is not sufficient with the adjacent layers. Accordingly, such desirable organic EL elements have not been achieved yet that can increase the amount of injected positive holes, actuate at lower voltages, exhibit lower leak currents at applying negative voltages, perform proper diode properties, exhibit appropriate adhesive ability with the adjacent layers to prevent delamination, and provide sufficient reliability.

The object of the present invention is to solve the above-described problems in the art and to achieve the following purposes; namely, the purposes of the present invention is to provide materials for a positive hole injecting layer that can increase the amount of injected positive holes; highly reliable organic EL elements that can provide higher luminance with lower voltage and exhibit lower leak current at negative biases and appropriate diode properties; and higher performance organic EL displays that utilize the organic EL elements.

SUMMARY OF THE INVENTION

Inventors of the present invention have investigated vigorously in order to solve the problems described above, and have developed the present invention. Namely, the present invention is based on the following experiences or discoveries: when a positive hole injecting layer containing a perfluoropolyether (PFPE) compound is formed on a positive electrode, the amount of injected positive holes can be further increased, the organic EL element can actuate at lower voltages, leak currents hardly flow for minus or negative voltages thus perform a appropriate diode property, and the occurrences of crosstalk can be reduced effectively.

The material for the positive hole injecting layer contains a perfluoropolyether compound. Accordingly, the positive hole injecting layer that is formed by the material for the positive hole injecting layer can provide higher amount of injected positive holes compared to conventional positive hole injecting layers formed by the other materials, and can exhibit proper diode properties with lower leak current at negative biases.

The organic EL element according to the present invention comprises an organic thin film layer that contains the positive hole injecting layer between a positive electrode and a negative electrode; the positive hole injecting layer comprises the perfluoropolyether compound. Accordingly, the organic EL element can represent appropriate adhesive ability since the positive hole injecting layer exhibits proper wettability against the adjacent positive electrode and the positive hole transporting layer thus hardly occurs the delamination between layers; in addition, the organic EL element can provide higher luminance with lower voltages since the amount of injected positive holes at the positive hole injecting layer is higher than the amounts of injected positive holes in the prior art.

Moreover, splintery rough surface that appears typically on the surface of positive electrodes may be smoothened by the positive hole injecting layer, thus the leak current is lowered at negative biases and proper diode properties can appear, and electrical short can be effectively relaxed. As a result, the organic EL display formed using the organic EL element can represent lower occurrences of cross talk.

Hereinafter, the crosstalk will be discussed in organic EL displays.

FIG. 1A shows a circuit diagram of crosstalk model in a passive matrix of an organic EL display, in which element B does not emit a light when only element A emits a light. As shown in FIG. 1B that is the equivalent circuit of the circuit diagram shown in FIG. 1A, current flows through the dotted line and the chain line, when element A emit a light. In the path of the chain line, since only the direction of element B is reverse to direct the current and thus element B does not flow current for a voltage of minus direction; therefore, element B performs as a diode, does not flow current, and does not emit a light. However, when the diode property of element B is insufficient or low, and the leak current flows significantly at negative voltages, the current flows not only through the way of dotted line but also the way of chain line, consequently, element B emit a light. The phenomenon that not only element A but also element B emit a light is referred to as "crosstalk". The occurrence of crosstalk causes problems such as decrease of luminance, thereby resulting in unclear images.

Since such crosstalk may be inhibited efficiently in the organic EL element according to the present invention, sufficient level of luminance may be obtained with lower voltages, and superior luminance and high reliability may be provided.

The organic EL display according to the present invention comprises the organic EL element according to the present invention. Accordingly, such crosstalk may be inhibited efficiently, sufficient level of luminance may be obtained with lower voltages, and superior luminance and high reliability may be provided.

Figure 1A:
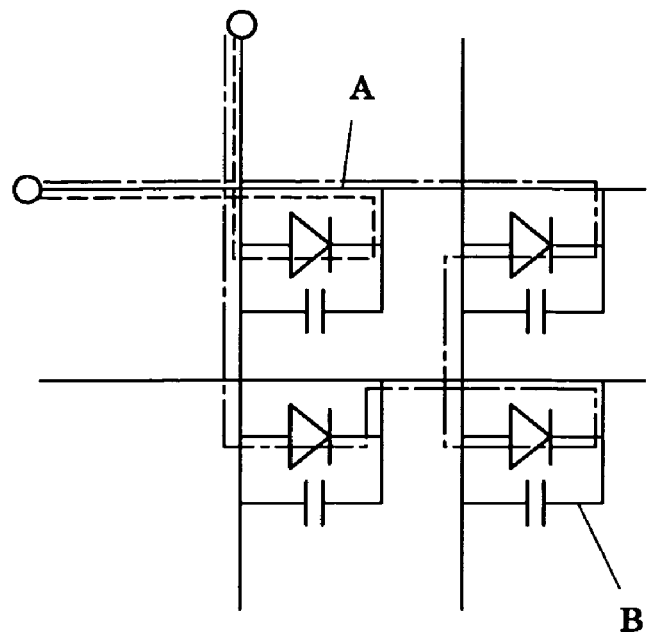
FIG. 1A shows a circuit diagram of crosstalk model in an organic EL panel.
Figure 1B:
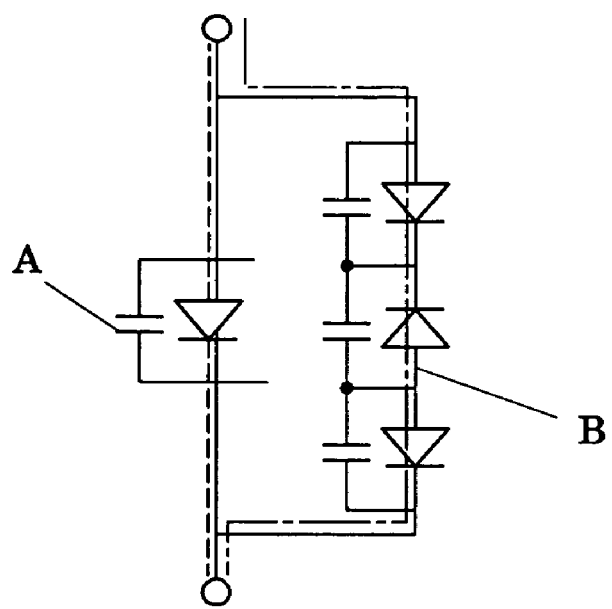
FIG. 1B shows the equivalent circuit of the circuit diagram shown in FIG. 1A.

DESCRIPTION OF THE PREFERRED EMBODIMENTS (Material for Positive Hole Injecting Layer)

The material for positive hole injecting layer comprises a perfluoropolyether compound and other components properly selected depending on requirements.

Perfluoropolyether Compound

The perfluoropolyether compound may be properly selected depending on the application; for example, may be compounds that have a perfluoropolyether skeleton. Preferably, the compounds may be expressed by the following formula (1) or (2).

$R^1$—Rf—$R^2$   formula (1)

Rf—$R^3$   formula (2)

in which, $R^1$, $R^2$, and $R^3$ in the formulas (1) and (2) may be identical or different each other, and each represents a hydrogen atom, fluorine atom, or substituted group.

Rf represents a perfluoropolyether skeleton expressed by the formula (3). Preferably, Rf is partially hydrogenated, for example, a part of fluorine atoms e.g. 50% or less in Rf may be substituted by hydrogen atoms.

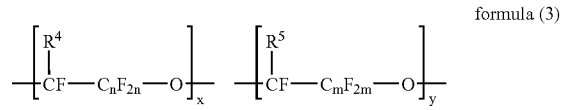

formula (3)

in which, $R^4$ and $R^5$ in the formula (3) may be identical or different each other, and each represents general formula —$C_pF_{2p+1}$ (in which, "p" is an integer of 0 or more, preferably is 0 to 10);

"n" and "m" may be identical or different each other, and are each an integer of 0 or more, preferably are 0 to 10;

"x" and "y" may be identical or different each other, and are each an integer of 1 or more, preferably are 1 to 200.

Specific examples of the perfluoropolyether skeleton expressed by Rf include those in Table 1 below. In Table 1, "p", "q", "l", "m", and "n" each represents an integer of 1 or more.

TABLE 1

| No. | Spieces of Perfluoropolyether Groups |
|---|---|
| 1 | $CF_2(OC_2F_4)_p(OCF_2)_qOCF_2$ |
| 2 | $CF_2(OC_2F_4)_p(OCF_2)_qOCF_2$ |
| 3 | $CF_2(OC_2F_4)_p(OCF_2)_qOCF_2$ |
| 4 | $CF_2(OC_2F_4)_p(OCF_2)_qOCF_2$ |
| 5 | $CF_2(OC_2F_4)_p(OCF_2)_qOCF_2$ |
| 6 | $CF_2(OC_2F_4)_p(OCF_2)_qOCF_2$ |
| 7 | $CF_2(OC_2F_4)_p(OCF_2)_qOCF_2$ |
| 8 | $F(CF_2CF_2CF_2O)_nCF_2CF_2$ |
| 9 | $F(CF_2CF_2CF_2O)_nCF_2CF_2$ |
| 10 | $F(CF_2CF_2CF_2O)_nCF_2CF_2$ |
| 11 | $F(CF_2CF_2CF_2O)_nCF_2CF_2$ |
| 12 | $CF_3(OCFCF_2)_m(OCF_2)_l$<br>$\quad\quad\quad\quad\;\;\;\mid$<br>$\quad\quad\quad\quad\;\;CF_3$ |
| 13 | $CF_3(OCFCF_2)_m(OCF_2)_l$<br>$\quad\quad\quad\quad\;\;\;\mid$<br>$\quad\quad\quad\quad\;\;CF_3$ |

TABLE 1-continued

| No. | Spieces of Perfluoropolyether Groups |
|---|---|
| 14 | $CF_3(OCFCF_2)_m(OCF_2)_l$ with branch $CF_3$ |

In the formulas (1) and (2), when $R^1$ to $R^3$ are each a substituted group as described above, the substituted group may be properly selected depending on the application; examples thereof include alkyl groups, aralkyl groups, alkenyl groups, aryl groups, cyano groups, amino groups, acyl groups, alkoxy carbonyl groups, carboxy group, alkoxy groups, alkyl sulfonyl groups, hydroxyl group, amide groups, aryloxy groups, aromatic hydrocarbon ring groups, aromatic heterocyclic groups, and groups expressed by formula (4) described later. These substituted groups may be further substituted by these other groups.

The alkyl groups are preferably those having 1 to 25 carbon atoms; specific examples of the alkyl groups include a methyl group, ethyl group, propyl group, isopropyl group, butyl group, isobutyl group, tert-butyl group, pentyl group, neopentyl group, hexyl group, cyclohexyl group, octyl group, nonyl group, decyl group, $C_{12}H_{25}$, $C_{14}H_{29}$, $C_{16}H_{33}$, $C_{18}H_{37}$, and $C_{24}H_{49}$.

Specific examples of the aryl groups include a phenyl group, tolyl group, xylyl group, biphenyl group, naphthyl group, anthryl group, and phenanthryl group.

Specific examples of the aralkyl groups include a benzyl group, phenylethyl group, and phenylpropyl group.

Specific examples of the alkenyl group include a vinyl group, aryl group, propenyl group, isopropenyl group, butenyl group, hexenyl group, cyclohexenyl group, and octenyl group.

The group expressed by formula (4) is as follows:

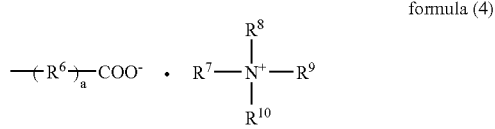

formula (4)

In the formula (4), $R^6$ represents a hydrocarbon group such as an alkyl group, aralkyl group, alkenyl group, and aryl group. A part of or entire of hydrogen atoms in these groups may be substituted by halogen atom such as fluorine, bromine, and chlorine. Further, "a" in the formula (4) represents an integer of 0 or more, preferably is 0 to 10, and more preferably is 0 to 5.

$R^7$ to $R^{10}$ may be identical or different each other, and each represents a hydrogen atom, fluorine atom, or hydrocarbon group. Examples of the hydrocarbon groups include an alkyl group, aralkyl group, alkenyl group, and aryl group. A part of or entire of hydrogen atoms in these groups may be substituted by halogen atom such as fluorine, bromine, and chlorine; cyano group, hydroxide group, amino group, aminoalkyl group, and phosphono group.

Specific preferable examples of substituent expresses by formula (4) are listed in Table 2 below.

TABLE 2

| No. | $R^7$ | $R^8$ | $R^9$ | $R^{10}$ |
|---|---|---|---|---|
| 1 | $C_{18}H_{37}$ | H | H | H |
| 2 | $C_{16}H_{33}$ | H | H | H |
| 3 | $C_{14}H_{29}$ | H | H | H |
| 4 | $C_{12}H_{25}$ | H | H | H |
| 5 | $C_{18}H_{35}$ | H | H | H |
| 6 | iso-$C_{18}H_{37}$ | H | H | H |
| 7 | $C_{18}H_{31}$ | H | H | H |
| 8 | $C_{18}H_{37}$ | $CH_3$ | $CH_3$ | H |
| 9 | $C_6H_5$(PHENYL) | H | H | H |
| 10 | $C_{12}H_{25}$ | $CH_3$ | $CH_3$ | $CH_3$ |
| 11 | $C_{24}H_{49}$ | H | H | H |
| 12 | $C_{18}H_{37}$ | H | H | H |
| 13 | $CH_2=CHC_{16}H_{32}$ | H | H | H |
| 14 | iso-$C_{18}H_{37}$ | H | H | H |

Perfluoropolyether compounds other than described above include perfluoropolyether amine salt compounds that are reaction products of perfluoropolyether compounds and amines.

The amine may be properly selected depending on the application: the amine may be one of primary amines, secondary amines, and tertiary amines, in addition, may be quaternary ammonium salts. Among these, those having an alkyl group are preferable, those having an alkyl group with 6 or more carbon atoms are more preferable, and those having an alkyl group with 10 or more carbon atoms are still more preferable.

The primary amines may be properly selected depending on the application; examples thereof include methylamine, ethylamine, n-propylamine, isopropylamine, n-butylamine, isobutylamine, t-butylamine, n-pentylamine, cyclopentylamine, isopentylamine, n-hexylamine, cyclohexylamine, n-octylamine, n-decylamine, 1-phenylethylamine, 2-phenylethylamine, allylamine, 2-dimethylaminoethylamine, and 2-methoxyethylamine.

The secondary amines may be properly selected depending on the application; examples thereof include dimethylamine, diethylamine, di-n-propylamine, diisopropylamine, di-n-butylamine, pyrrolidine, piperidine, hexamethyleneamine, piperazine, and morpholine.

The tertiary amines may be properly selected depending on the application; examples thereof include trialkylamine such as triethylamine, tributylamine, trihexylamine, and triamylamine; alkanolamine such as triethanolamine and dimethylaminoethanol; fatty or non-aromatic cyclic amines such as triethylenediamine; aromatic amines such as dimethylphenylamine, dimethylbenzylamine, 2-(dimethylaminomethyl)phenol, 2,4,6-tris(dimethylaminomethyl)phenol, dimethylaniline, pyridine, and picoline; and alicyclic amines such as 1,8-diazabicyclo[5.4.0]undecene-1.

The quaternary ammonium salts may be properly selected depending on the application; examples thereof include tetraalkyl ammonium halide such as tetramethylammonium chloride, tetraethylammonium chloride, and tetrabutylammonium bromide; trialkyl aralkyl ammonium halide such as trimethylbenzyl ammonium chloride, triethylbenzyl ammonium chloride, and tripropylbenzyl ammonium chloride; and N-alkylpyridinium halide such as N-methypyridinium chloride.

Specific examples of perfluoropolyether amine salt compounds include a reaction product between the perfluoropolyether indicated below that has carboxyl groups at both ends thereof (hereinafter, "multi-functional perfluoropolyether") and an amine, or a reaction product between the perfluoropolyether indicated below that has carboxyl groups at one end thereof (hereinafter, "mono-functional perfluoropolyether) and an amine.

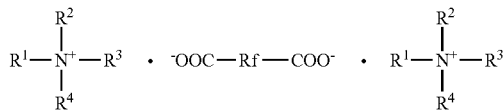

Rf represents a perfluoropolyether skelton; $R^1$, $R^2$, $R^3$, and $R^4$ are each a hydrogen or hydrocarbon group.

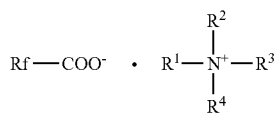

Rf represents a perfluoropolyether skelton; $R^1$, $R^2$, $R^3$, and $R^4$ each represents a hydrogen atom or hydrocarbon group.

The perfluoropolyether amine salt compounds may be partially hydrogenated in the perfluoropolyether skeleton. For example, a part of fluorine atoms, 50% or less for example, in perfluoropolyether skeleton may be substituted by hydrogen atoms.

The perfluoropolyether amine salt compounds may be conveniently synthesized from the perfluoropolyethers and amines or diamines by the following method. Namely, a mono-functional perfluoropolyether or a multi-functional perfluoropolyether, and an amine or a diamine are mixed and heated to a temperature of above the melting point of the amine or diamine, 60° C. or more for example, in case of stearylamine, thereby the perfluoropolyether amine salt compound may be synthesized.

The weight-averaged molecular weight of the perfluoropolyether compound may be properly selected depending on the application, preferably is 500 to 10000, more preferably is 1000 to 6000.

When the weight-averaged molecular weight of the perfluoropolyether compound is less than 500, the effect to increase the amount of injected positive holes may be insufficient, on the other hand, above 10000 of the molecular weight may decrease the solubility into solvents, resulting in poor film forming ability.

The perfluoropolyether compounds may be synthesized, or prepared from commercial products. Examples of the commercial products include Z-dol 1000, Z-dol 2000, Z-dol 4000 (product name, by Ausimont K. K.).

The materials for positive hole injecting layer according to the present invention may be applied appropriately to various technical fields such as for LEDs (light emitting diodes), organic EL elements, and the like, in particular may be utilized for positive hole injecting layers of organic EL elements according to the present invention.

(Organic EL Element)

The organic EL element according to the present invention comprises an organic thin film layer, between a positive electrode and a negative electrode, that contains a positive hole injecting layer; the positive hole injecting layer comprises the perfluoropolyether compound.

The organic thin film layer is not particularly defined except that the layer should comprise a positive hole injecting layer, thus may be properly selected depending on the application. For example, the organic thin film layer may comprise a positive hole transporting layer, positive hole blocking layer, light emitting layer, electron transporting layer, and electron injecting layer.

The layer construction the organic EL element according to the present invention may be properly selected depending on the application; suitable examples thereof include the following layer constructions (1) to (13):

(1) Positive electrode/positive hole injecting layer/positive hole transporting layer/light emitting layer/electron transporting layer/electron injecting layer/negative electrode, (2) Positive electrode/positive hole injecting layer/positive hole transporting layer/light emitting layer/electron transporting layer/negative electrode, (3) Positive electrode/positive hole transporting layer/light emitting layer/electron transporting layer/electron injecting layer/negative electrode, (4) Positive electrode/positive hole transporting layer/light emitting layer/electron transporting layer/negative electrode, (5) Positive electrode/positive hole injecting layer/positive hole transporting layer/light emitting and electron transporting layer/electron injecting layer/negative electrode (6) Positive electrode/positive hole injecting layer/positive hole transporting layer/light emitting and electron transporting layer/negative electrode, (7) Positive electrode/positive hole transporting layer/light emitting and electron transporting layer/electron injecting layer/negative electrode, (8) Positive electrode/positive hole transporting layer/light emitting and electron transporting layer/negative electrode, (9) Positive electrode/positive hole injecting layer/positive hole transport and light emitting layer/electron transporting layer/electron injecting layer/negative electrode

(10) Positive-electrode/positive hole injecting layer/positive hole transport and light emitting layer/electron transporting layer/negative electrode,

(11) Positive electrode/positive hole transport and light emitting layer/electron transporting layer/electron injecting layer/negative electrode,

(12) Positive electrode/positive hole transporting and light emitting layer/electron transporting layer/negative electrode,

(13) Positive electrode/positive hole transport, light emitting and electron transporting layer/negative electrode.

When the organic EL element has a positive hole blocking layer, the layer constructions are proper with respect to (1) to (13) in which each positive hole blocking layer is disposed between the light emitting layer and the electron transporting layer.

Figure 2:
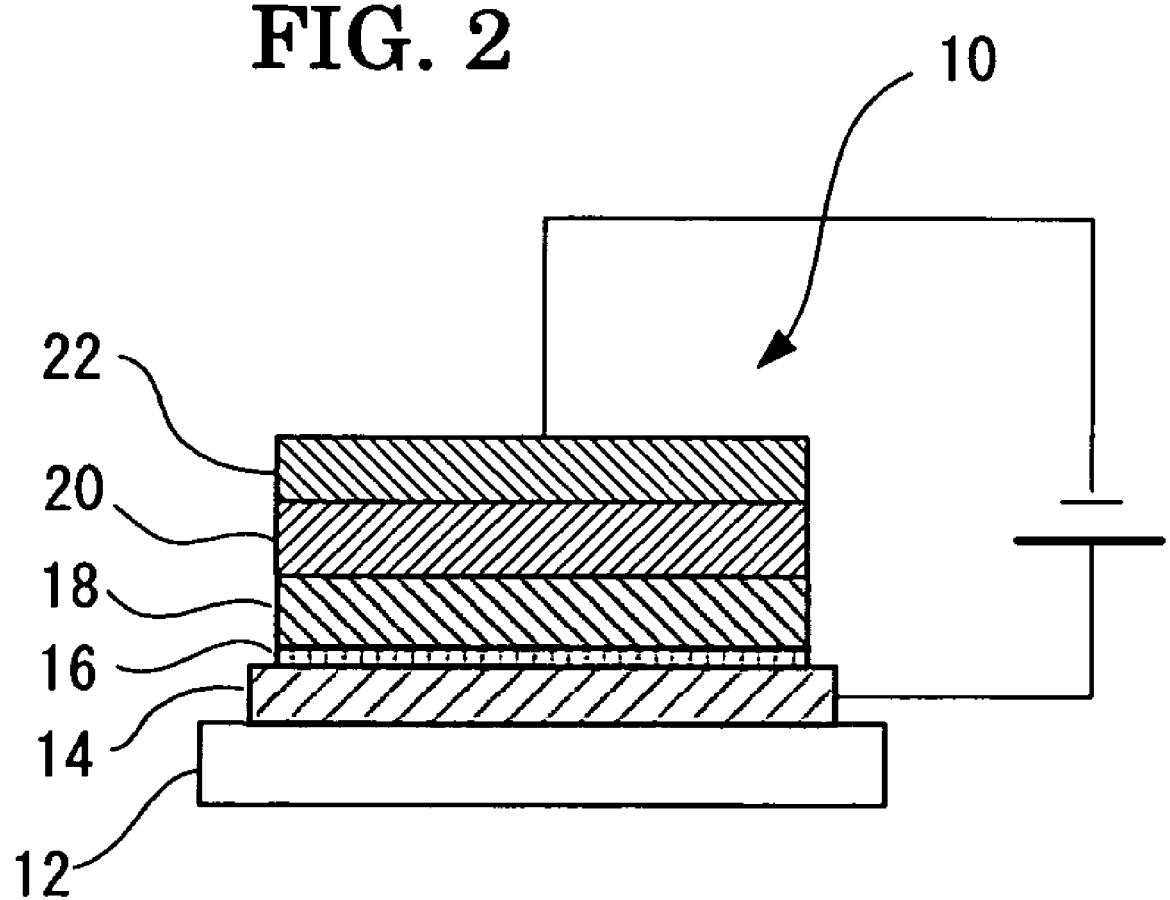
FIG. 2 is an exemplary schematic view that explains a layer construction of an organic EL element according to the present invention.

Among these layer constructions, the aspect (4) of positive electrode/positive hole transporting layer/light emitting layer/electron transporting layer/negative electrode is shown in FIG. 2. Organic EL element 10 has a layer construction comprising positive electrode 14 (e.g. ITO electrode) formed on glass substrate 12, positive hole transporting layer 16, light emitting layer 18, electron transporting layer 20, and negative electrode 22 (e.g. Al—Li electrode) laminated in this order. Positive electrode 14 (e.g. ITO electrode) and negative electrode 22 (e.g. Al—Li electrode) are interconnected through a power supply. Organic thin film layer 24 which emits red light is formed by positive hole transporting layer 16, light emitting layer 18, and electron transporting and light emitting layer 20.

Positive Electrode

The positive electrode may be properly selected depending on the application. Preferably, the positive electrode supplies positive holes or carriers to the organic thin film layer.

The material of the positive electrode may be properly selected depending on the application from metals, alloys, metal oxides, electrically conducting compounds, mixtures thereof and the like, for example. Among these, materials having a work function of 4 eV or more are preferable.

Specific examples of the material of the positive electrode include electrically conducting metal oxides such as tin oxide, zinc oxide, indium oxide, indium tin oxide (ITO), metals such as gold, silver, chromium, and nickel, mixtures or laminates of these metals and electrically conducting metal oxides, inorganic electrically conducting substances such as copper iodide and copper sulfide, organic electrically conducting materials such as polyaniline, polythiophene and polypyrrole, and laminates of these with ITO. These may be used singly or in combination. Among these, electrically conducting metal oxides are preferable, and ITO is particularly preferable from the viewpoints of productivity, high conductivity, and transparency.

The thickness of the positive electrode may be properly selected depending on the material etc.; preferably the thickness is 1 to 5000 nm, more preferably is 20 to 200 nm.

The positive electrode is typically formed on a substrate of glass such as soda lime glass and non-alkali glass, or transparent resin.

When a glass is employed as the substrate, non-alkali glass or soda lime glass with a barrier layer of silica or the like is preferable from the viewpoint suppressing the elution of ions from the glass.

There is no particular limitation on the thickness of the substrate provided that the mechanical strength is sufficient. When a glass is employed as the substrate, the thickness is typically 0.2 mm or more, preferably is 0.7 mm or more.

The positive electrode may be conveniently formed by conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, transfer method, and method of applying a dispersion of ITO by chemical reaction method (sol-gel process etc.).

By washing the positive electrode and performing other treatment, the driving voltage of the organic EL element may be reduced, and the light emitting efficiency may also be increased. Examples of other treatment include UV ozonization, plasma processing and the like, when the material of the positive electrode is ITO.

Positive Hole Injecting Layer

Figure 7:
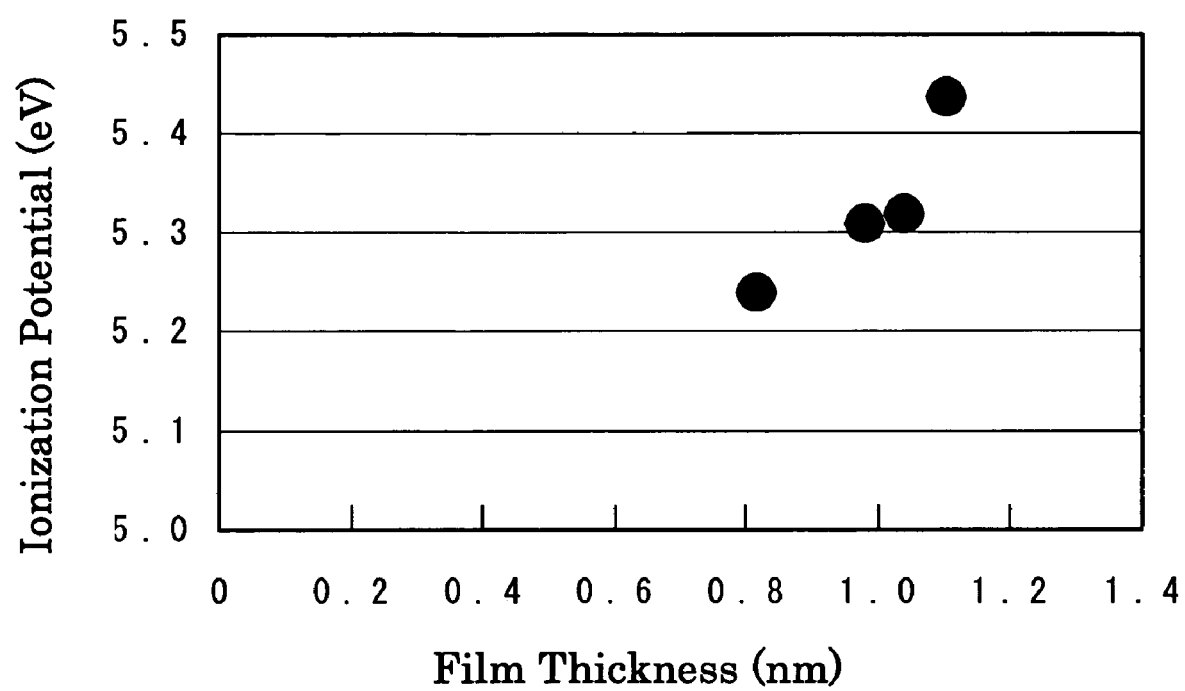
FIG. 7 is a graph that shows a relation between the thickness of the positive hole injecting layer and the ionization potential.

The positive hole injecting layer performs to cause injection of positive holes from the positive electrode at applying a voltage and to transport the positive holes to the positive hole transporting layer. Preferably, the ionization potential in the positive hole injecting layer exists at the site between the ionization potential of the positive electrode and the ionization potential of the positive hole transporting layer at the highest occupied molecular orbital (HOMO) as shown in FIG. 7, i.e. the ionization potential in the positive hole injecting layer is lower than the ionization potential in the positive electrode and higher than the ionization potential in the positive hole transporting layer at the highest occupied molecular orbital (HOMO). In this condition, the energy barrier is lower for injecting positive holes from the positive hole injecting layer into the organic thin film layer, therefore the current flows more for the positive voltage and the luminous efficiency increases advantageously. The term "ionization potential" means the energy required to carry one electron from the ground state in an atom or molecule to infinite-point, in other words means the ionization energy expressed in terms of electron volt (eV).

The value of the ionization potential in the positive hole injecting layer can not be defined clearly since the value depends on the thickness of the positive hole injecting layer; generally the value of the ionization potential is about 4.8 to 5.6 eV. The ionization potential can be measured by conventional apparatuses for measuring ionization potentials.

The positive hole injecting layer comprises the perfluoropolyether compound, preferably is formed of the material for positive hole injecting layer according to the present invention.

When the positive hole injecting layer is formed of the material for positive hole injecting layer according to the present invention, the ionization potential in the positive hole injecting layer can be controlled easily within a preferable range, and the adhesive ability of the positive hole injecting layer is advantageously higher with the adjacent layers of the positive electrode and the positive hole transporting layer due to the proper wettability.

The positive hole injecting layer can be conveniently formed by conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, and transfer method.

The specific method as to the vapor deposition may be properly selected depending on the application; a vacuum vapor deposition, resistance heating vapor deposition, chemical vapor deposition, and physical vapor deposition are preferably exemplified. Examples of chemical vapor deposition include plasma CVD, laser CVD, heat CVD and gas source CVD.

Specific examples of the wet film forming methods include an ink-jet method, spin coating method, kneader coating method, bar coating method, blade coating method, casting method, dip coating method, curtain coating method, and the like.

In the wet film forming method, a solution may be used or applied into which the material of the light emitting layer is dissolved or dispersed together with a resin component. Examples of the resin component include polyvinyl carbazoles, polycarbonates, polyvinyl chlorides, polystyrenes, polymethyl methacrylates, polyesters, polysulfones, polyphenylene oxides, polybutadiene, hydrocarbon resins, ketone resins, phenoxy resins, polyamides, ethyl cellulose, vinyl acetate, acrylonitrile butadiene styrene (ABS) resins, polyurethane, melamine resins, unsaturated polyester resins, alkyd resins, epoxy resins, and silicone resins.

In the wet film forming method, the positive hole injecting layer may be preferably formed, for example, by applying and drying a solution or coating liquid into which the material for the positive hole injecting layer and optional resin component are dissolved.

The solvent may be properly selected without particular limitations from conventional or commercial products; examples thereof include FC77 (by 3M), Vertrel XF (by DuPont Co.) and the like.

The thickness of the positive hole injecting layer may be selected depending on the application; for example, the thickness is preferably 10 nm or less, more preferably is 0.1 to 10 nm. When the thickness of the positive hole injecting layer is above 10 nm, the positive holes may not flow into the light emitting layer smoothly.

Positive Hole Transporting Layer

The positive hole transporting layer may be properly selected depending on the application; preferably, the positive hole transporting layer may perform to transport positive holes from the positive electrode at applying an electric field.

The material of the positive hole transporting layer may be properly selected depending on the application; examples thereof include aromatic amine compounds, carbazole, imidazole, triazole, oxazole, oxadiazole, polyarylalkane, pyrazoline, pyrazolone, phenylene diamine, arylamine, amino-substituted chalcone, styryl anthracene, fluorenone, hydrazone, stilbene, silazane, styryl amine, aromatic dimethylidene compounds, porphyrin compounds, electrically conducting oligomers and polymers such as polysilane compounds, poly(N-vinyl carbazole), aniline copolymers, thiophene oligomers and polymers and polythiophene, and carbon films. When the material of the positive hole transporting layer is mixed with the material of the light emitting layer to form a film, a combined layer may be formed that performs as a light emitting layer and also as a positive hole transporting layer, i.e. a light emitting and positive hole transporting layer.

These materials of the positive hole transporting layer may be used singly or in combination. Among these, aromatic amine compounds are preferable, more preferably is TTD (N, N'-diphenyl-N, N'-bis (3-methylphenyl)-[1,1'-biphenyl]-4, 4'-diamine) expressed by the following formula, and NPD (N, N'-dinaphthyl-N, N'-diphenyl-[1,1'-biphenyl]-4, 4'-diamine) expressed by the following formula, and the like.

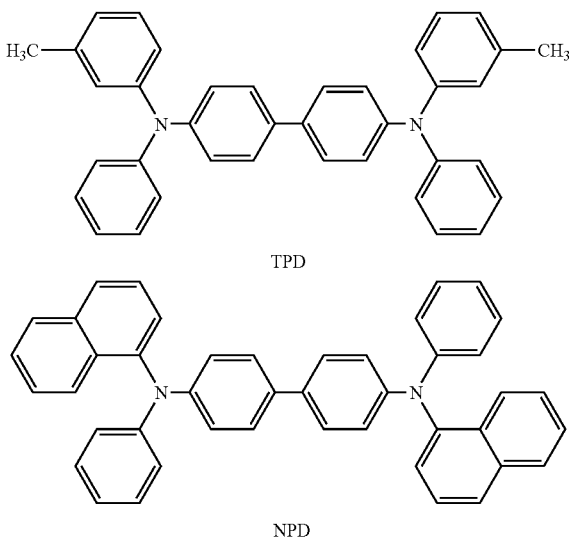

TPD

NPD

The thickness of the positive hole transporting layer may be properly selected depending on the application; usually the thickness is 1 to 500 nm, and preferably is 10 to 100 nm.

The positive hole transporting layer may be appropriately formed by conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, and transfer method.

Light Emitting Layer

The positive holes can be injected to the light emitting layer from the positive electrode, positive hole injecting layer, positive hole transporting layer and the like at applying electric field. The light emitting layer provides sites to recombine the positive holes and the electrons, and contains a light emitting material that emit a light of intended color due to the recombination energy caused by the recombination.

The light emitting material may be properly selected from conventional materials that emit green light, blue light, yellow light, or red light depending on the application.

The materials that emit green light may be selected without particular limitations as long as capable of emitting green light; for example, the material may be aluminum quinolium complexes, benzoquinolinol Be complexes and the like.

The materials that emit blue light may be selected without particular limitations as long as capable of emitting blue light; for example, the material may be benzooxazol Zn complexes, quinolinol complexes and the like.

The materials that emit yellow light may be selected without particular limitations as long as capable of emitting yellow light; for example, the material may be four-coordinated 8-quinolinol Zn complex.

The materials that emit red light may be selected without particular limitations as long as capable of emitting red light; for example, an organic EL element using a DCM dye is disclosed as an organic EL element which can emit red (R) light in C. W. Tang, S. A. VanSlyke, and C. H. Chen, "Journal of Applied Physics", Vol. 65, 3610 (1989). Further, organic EL elements, which use a porphin compound or a porphine compound which can emit red light, are proposed in JP-A No. 9-13024, JP-A No. 9-296166, JP-A No. 11-251061, JP-A No. 11-251062, and WO98/00474. Further, an organic EL element using a bisanthrene compound, which can emit red light, is disclosed in JP-A No. 11-144868.

The light emitting layer may be properly produced by conventional methods such as a vapor deposition method, wet film forming method, MBE (molecular beam epitaxial) method, cluster ion beam method, molecule laminating method, LB method, printing method, transfer method, and the like.

The thickness of the light emitting layer is preferably 1 to 50 nm, more preferably is 3 to 20 nm.

The light emitting layer having a thickness within the preferable range may lead to sufficient light emitting efficiency, emitting luminance, and color purity emitted by the organic EL element.

The light emitting layer may be designed to perform also as a positive hole transporting layer and/or an electron transporting layer, such as a combined layer of light emitting and positive hole transporting layer, or a combined layer of light emitting and electron transporting layer.

The light emitting layer, the combined layer of light emitting and positive hole transporting layer, or the combined layer of light emitting and electron transporting layer comprises the light emitting material as a guest material, and preferably comprises a host material additionally of which the emitting wavelength is near the absorbing wavelength of the guest material. The host material is usually contained in the light emitting layer, otherwise may be contained in the positive hole transporting layer, electron transporting layer, or the like.

When the guest material and host material are used in conjunction in a process of organic EL luminescence, the host material is excited first. Since the emitting wavelength of the host material and the absorbing wavelength of the guest material overlap, excitation energy is efficiently transferred from the host material to the guest material, and since the host material returns to the ground state without emitting light and only the guest material which is in an excited state emits excitation energy as light, the light emitting efficiency and color purity are excellent.

In general, when only one species of luminescent molecules is present or the molecules are contained at high concentration in a thin film, the luminescent molecules are so close to each other that they interact, and a so-called "concentration quenching" effect occurs in which the light emitting efficiency declines. However, when the guest material and host material are used together, the guest compound is dispersed at relatively low concentration in the host compound, so the "concentration quenching" effect is effectively suppressed and an excellent light emitting efficiency is obtained. The use of the two materials in combination is therefore advantageous. Moreover, by using the guest material together with the host material in the light emitting layer, as the host material generally has excellent film-forming properties, the combination has excellent film-forming properties while maintaining luminescent properties.

The host material may be properly selected depending on the application; preferably, the emitting wavelength of the host material is near the absorbing wavelength of the guest material. Typically, the host materials are classified into host materials of lower molecular weight and host materials of higher molecular weight.

Preferable examples of the host materials of lower molecular weight include 1,3,6,8-tetraphenylpyrene (tppy), N,N'-dinaphthyl-N,N'-diphenyl-[1,1'-biphenyl]-4,4'-diamine (NPD), aromatic amine derivatives expressed by formula (5), carbazole derivatives expressed by formula (7), oxine complexes expressed by formula (9), 1,3,6,8-tetraphenylpyrene expressed by formula (11), 4,4'-bis(2,2'-diphenylvinyl)-1,1'-biphenyl (DPVBi) expressed by formula (13) (main emission wavelength=470 nm), p-sexiphenyl expressed by formula (14) (main emission wavelength=400 nm), and 9,9'bianthryl expressed by formula (15) (main emission wavelength=460 nm).

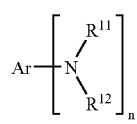

formula (5)

In the formula (5), "n" is 2 or 3, Ar is a divalent or trivalent aromatic group or a heterocyclic aromatic group, $R^{11}$ and $R^{12}$ may be identical or different, and are a monovalent aromatic group or heterocyclic aromatic group. The aromatic group or heterocyclic aromatic group may be properly selected depending on the application.

Among the aromatic amine derivatives expressed by the formula (5), N,N'-dinaphthyl-N,N'-diphenyl-[1,1'-biphenyl]-4,4'-diamine (NPD) expressed by the following formula (6) (main emission wavelength =430 nm) and its derivatives are preferable.

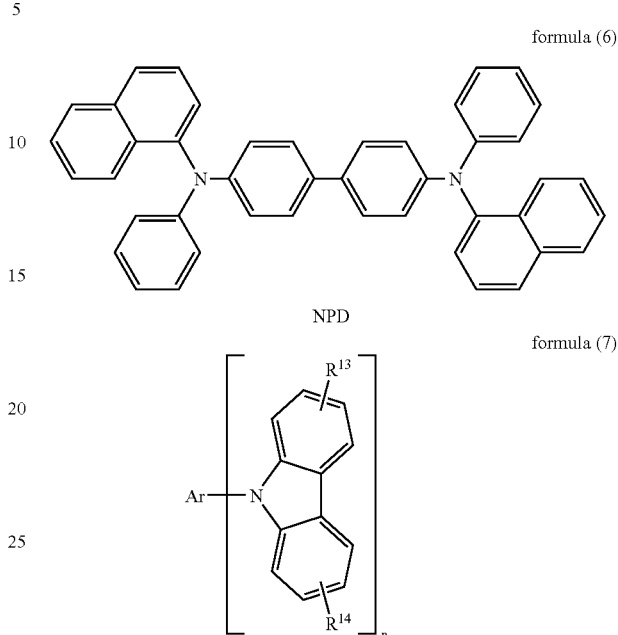

In the formula (7), Ar is a divalent or trivalent group containing an aromatic ring as shown below, or a divalent or trivalent group containing a heterocyclic aromatic ring.

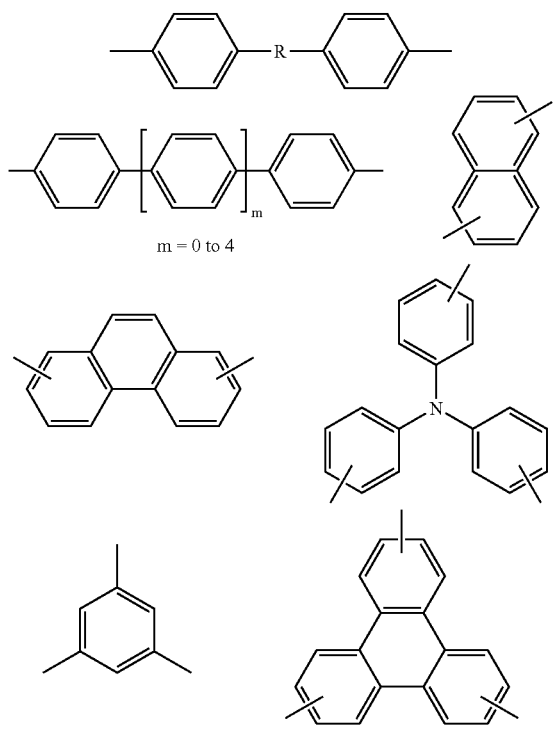

These may be substituted by a non-conjugated group. In the formulas, R represents a crosslinking group; examples thereof are shown below.

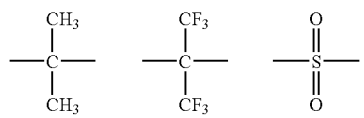

In the formula (7), $R^{13}$ and $R^{14}$ are selected independently from a hydrogen atom, halogen atom, alkyl groups, aralkyl groups, alkenyl groups, aryl groups, cyano groups, amino groups, acyl groups, alkoxy carbonyl groups, carboxyl group, alkoxy groups, alkyl sulfonyl groups, hydroxyl group, amide groups, aryloxy groups, aromatic hydrocarbon ring or aromatic heterocyclic groups, and these may be further substituted by substituents. In the formula (7), "n" represents an integer, and 2 and 3 are preferable.

Among the aromatic amine derivatives expressed by the formula (7), the compound in which Ar is an aromatic group such that two benzene rings are connected via a single bond, $R^{13}$ and $R^{14}$ are each a hydrogen atom, and n=2, i.e., 4,4'-bis (9-carbazolyl)-biphenyl (CBP) represented by the following formula (8) (main emission wavelength=380 nm) and its derivatives are preferable in terms of excellent light emitting efficiency, and the like.

formula (8)

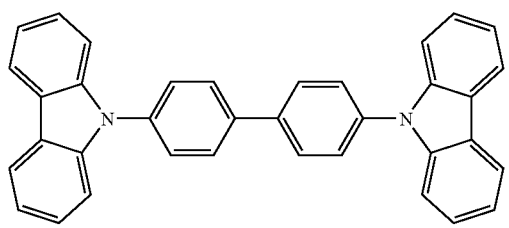

CBP formula (9)

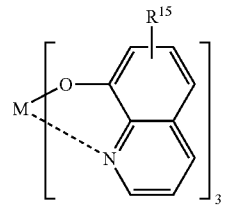

In the formula (9), $R^{15}$ represents a hydrogen atom or monovalent hydrocarbon group.

Among oxine complexes represented by the formula (9), the aluminum quinoline complex (Alq) represented by the following formula (10) (main emission wavelength=530 nm) is preferable.

formula (10)

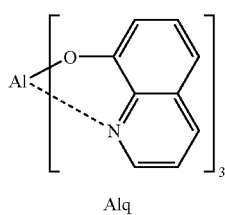

Alq

-continued formula (11)

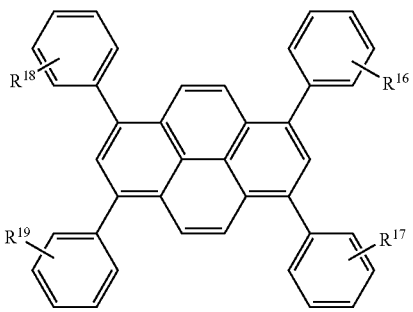

in which, $R^{16}$ to $R^{19}$ in the formula (11) may be identical or different, and represent a hydrogen atom or substituent group respectively. The substituent may be one of alkyl groups, cycloalkyl groups, or aryl groups for example, and these may be further substituted by a substituent.

Among the 1,3,6,8-tetraphenylpyrenes represented by the formula (11), the compound in which $R^{16}$ to $R^{19}$ are hydrogen atoms, i.e., the 1,3,6,8-tetraphenylpyrene represented by the following formula (12) (main emission wavelength=440 nm) is preferable from the viewpoint of excellent light emitting efficiency, and the like.

formula (12)

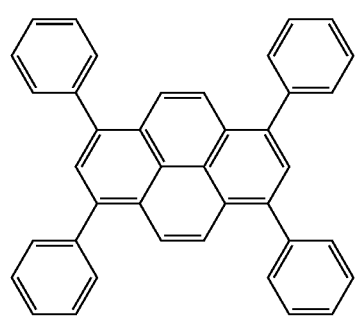

1,3,6,8-tetraphenylpyrene formula (13)

DPVBi formula (14)

p-sexiphenyl formula (15)

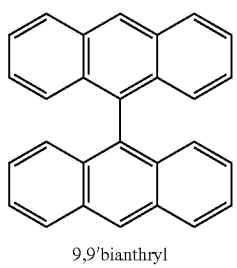

9,9'bianthryl

As for the host materials of higher molecular weight, polyparaphenylenevinylenes (PPV), polythiophenes (PAT), polyparaphenylenes (PPP), polyvinylcarbazols (PVCz), polyfluorenes (PF), polyacetylenes (PA), and derivatives thereof are exemplified. Among these, polyvinylcarbazols (PVCz) expressed by formula (16) are preferable.

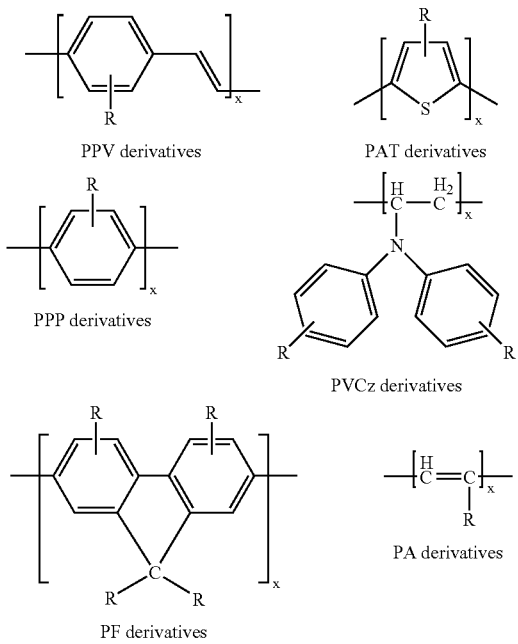

PPV derivatives
PAT derivatives
PPP derivatives
PVCz derivatives
PF derivatives
PA derivatives in which, R represents one of a hydrogen atom, halogen atoms, alkoxy groups, amino groups, alkyl groups, cycloalkyl groups, aryl groups that may contain a nitrogen atom or sulfur atom, or aryloxy groups; and these may be further substituted by a substituent.

formula (16)

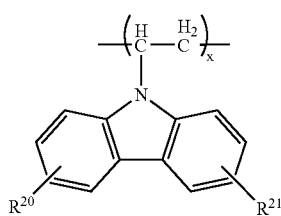

in which, $R^{20}$ and $R^{21}$ in the formula (16) represent respectively plural substituents attached to any sites of cyclic structure. $R^{20}$ and $R^{21}$ may be identical or different, and represent respectively one of a hydrogen atom, halogen atoms, alkoxy groups, amino groups, alkyl groups, cycloalkyl groups, aryl groups that may contain a nitrogen atom or sulfur atom, or aryloxy group; and these may be further substituted by a substituent. $R^{20}$ and $R^{21}$ may connect each other to form a ring that may contain a nitrogen, sulfur, or oxygen atom; and these may be further substituted by a substituent; "x" represents an integer.

Positive Hole Blocking Layer

The positive hole blocking layer may be properly selected depending on the application; such a layer is preferable that may perform to barrier the positive holes injected from the positive electrode.

The positive hole blocking layer may properly selected depending on the application.

When the organic EL element comprises a positive hole blocking layer, positive holes transported from the positive electrode are blocked by the positive hole blocking layer, and electrons transported from the negative electrode are transmitted through this positive hole blocking layer to reach the light emitting layer. Hence, recombination of electrons and positive holes occurs efficiently in the light emitting layer, and recombination of positive holes and electrons in the organic thin film layer other than the light emitting layer can be prevented. Thus, the luminescence is obtained efficiently from the intended material for emitting light, and this is advantageous in respect of color purity.

The positive hole blocking layer is preferably disposed between the light emitting layer and the electron transporting layer.

The thickness of the positive hole blocking layer may be properly determined depending on the application; for example, usually the thickness is about 1 to 500 nm, and preferably is 10 to 50 nm.

The positive hole blocking layer may be a single layer structure, or may be a laminated structure. The positive hole blocking layer may be conveniently formed by conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, or transfer method.

Electron Transporting Layer

The electron transporting layer may be properly selected depending on the application; for example, such a layer is preferable that performs to transport electrons from the negative electrode, or to act as a barrier to positive holes injected from the positive electrode.

The electron transporting layer may be properly selected depending on the application; examples thereof include quinoline derivatives such as aluminum quinoline complexes (Alq), oxadiazole derivatives, triazole derivatives, phenanthroline derivatives, perylene derivatives, pyridine derivatives, pyrimidine derivatives, quinoxaline derivatives, diphenylquinone derivatives and nitro-substituted fluorene derivatives. When one of these materials for electron transporting layer is mixed with a material for the light emitting layer to form a film, an electron transporting and light emitting layer can be formed, and when a material for the positive hole transporting layer is also mixed to form a film, an electron transporting, positive hole transporting and light emitting layer can be formed. In this case, a polymer such as polyvinyl carbazole or polycarbonate can be used.

The thickness of the electron transporting layer may be properly selected depending on the application; for example, usually the thickness is about 1 to 500 nm, and preferably is 10 to 50 nm.

The electron transporting layer may be a single layer construction or a laminated construction.

In this case, it is preferable that an electron transporting material used for the electron transporting layer adjacent to the light emitting layer has an optical absorption edge at a shorter wavelength than that of the material for emitting light so that it limits the luminescence region in the organic EL element to the light emitting layer and prevents unwanted luminescence from the electron transporting layer. Examples of the electron transporting material include phenanthroline derivatives, oxadiazole derivatives and triazole derivatives; more preferable examples include 2,9-dimethyl-4,7-diphenyl-1,10-phenanthroline (BCP) represented by the following formula (17) and the compounds shown below.

formula (17)

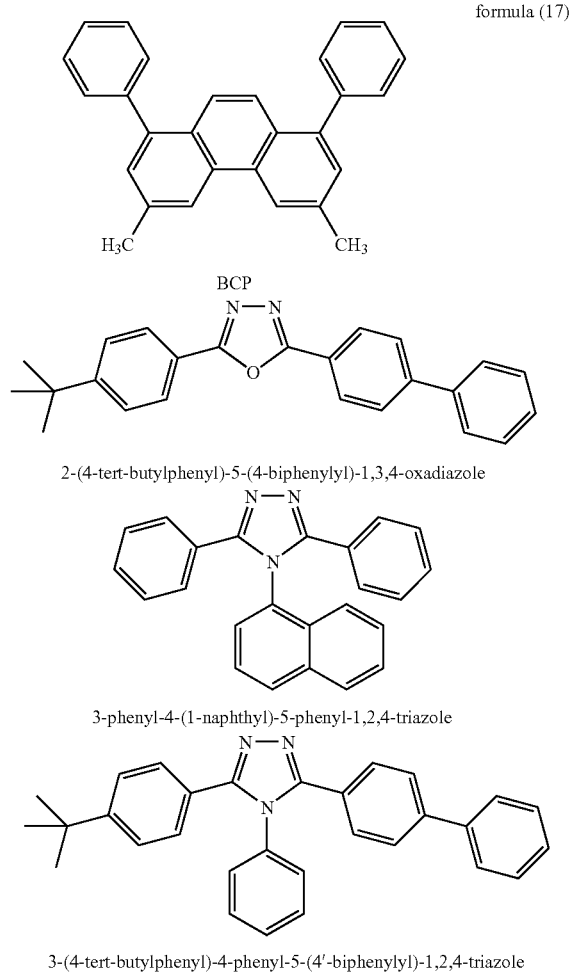

BCP 2-(4-tert-butylphenyl)-5-(4-biphenylyl)-1,3,4-oxadiazole 3-phenyl-4-(1-naphthyl)-5-phenyl-1,2,4-triazole 3-(4-tert-butylphenyl)-4-phenyl-5-(4'-biphenylyl)-1,2,4-triazole The electron transporting layer can be conveniently formed by conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, or transfer method.

Electron Injecting Layer

The electron injecting layer may be properly selected depending on the application, preferably performs to be injected electrons from the negative electrode and to transport them to the electron transporting layer.

The material may be properly selected depending on the application; for example, the material is alkaline metal fluoride such as lithium fluoride, alkaline earth metal fluoride such as strontium fluoride, or the like.

The thickness of the electron injecting layer may be properly selected depending on the application; for example, the thickness is usually 0.1 to 10 nm, preferably is 0.5 to 2 nm.

The electron injecting layer may be produced conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, and transfer method.

Negative Electrode

The negative electrode may be properly selected depending on the application. It is preferable that the positive electrode supplies positive holes or carriers to the organic thin film layer, specifically, to a light emitting layer when the organic thin film layer comprises only the light emitting layer or to an electron transporting layer when the organic thin film layer further comprises the electron transporting layer, or to an electron injecting layer when the electron injecting layer is present between the organic thin film layer and the negative electrode.

The material of the negative electrode may be properly selected depending on the adhesion properties with the layers or molecules adjoining the negative electrode, such as the electron transporting layer and light emitting layer, and according to ionization potential, stability and the like. Examples thereof include a metal, alloy, metal oxide, electrically conducting compound, and mixture thereof.

Examples of the material of the negative electrode include alkali metals such as Li, Na, K, and Cs; alkaline earth metals such as Mg and Ca; gold, silver, lead, aluminum, sodium-potassium alloys or mixtures thereof, lithium-aluminum alloys or mixtures thereof, magnesium-silver alloys or mixtures thereof, rare earth metals such as indium and ytterbium, and alloys thereof.

These may be used singly or in combination. Among these, materials having a work function of 4 eV or less are preferable. Aluminum, lithium-aluminum alloys or mixtures thereof, or magnesium-silver alloys or mixtures thereof are more preferable.

The thickness of the negative electrode may be properly determined depending on the material of the negative electrode and the like; preferably the thickness is 1 to 10000 nm, more preferably is 20 to 200 nm.

The negative electrode can be conveniently formed by conventional methods such as a vapor deposition method, wet film forming method, electron beam method, sputtering method, reactive sputtering method, molecular beam epitaxy (MBE) method, cluster ion beam method, ion plating method, plasma polymerization method (high frequency excitation ion plating method), molecule laminating method, Langmuir-Brodgett (LB) method, printing method, and transfer method.

When two or more materials are used together as the material of the negative electrode, the materials may be vapor-deposited simultaneously to form an alloy electrode, or a pre-prepared alloy is made then may be vapor-deposited to form an alloy electrode.

Preferably, the resistances of the positive electrode and negative electrode are lower, and are below several hundreds ohm/square.

Other Layers

The organic EL element of the present invention may have other layers such as a protective layer, depending on the application.

The protective layer may be properly selected depending on the application; for example, such a layer is preferable that can prevent molecules or substances as moisture or oxygen which promote deterioration of the organic EL element, from penetrating into the organic EL element.

Examples of the material of the protective layer include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; nitrides such as SiN and SiNxOy; metal fluorides such as $MgF_2$, LiF, $AlF_3$, $CaF_2$; polyethylene, polypropylene, polymethyl methacrylate, polyimide, polyurea, polytetrafluoroethylene, polychlorotrifluoroethylene, polydichlorodifluoroethylene, copolymer of chlorotrifluoroethylene and dichlorodifluoroethylene, copolymer obtained by copolymerizing a monomer mixture comprising tetrafluoroethylene and at least one comonomer, fluorine-containing copolymer having a ring structure in a main chain of the copolymer, water-absorbing substance having a water absorption rate of 1% or more, and damp-proof substance having a water absorption rate of 0.1% or less.

The protective layer may be conveniently formed by conventional methods such as a vapor deposition method, wet film forming method, sputtering method, reactive sputtering method, molecular beam epitaxy (MBE) method, cluster ion beam method, ion plating method, plasma polymerization method (high frequency excitation ion plating method), printing method, and transfer method.

From the viewpoint of light emitting efficiency of the organic EL element according to the present invention, it is desired that it emits red light at a voltage of 10 Volts or less, preferably at a voltage of 7 Volts or less, and more preferably at a voltage of 5 Volts or less.

It is preferable that, at an applied voltage of 10 Volts, the emission luminance of the organic EL element of the present invention is 100 $cd/m^2$ or more, more preferably 500 $cd/m^2$ or more, and particularly preferably 1000 $cd/m^2$ or more.

The organic EL element according to the present invention is especially useful in various fields such as computers, vehicle-mounted display devices, field-ready display devices, home apparatuses, industrial apparatuses, household electric appliances, traffic display devices, clock display devices, calendar display units, luminescent screens and audio equipment, and is particularly convenient for the organic EL display of the present invention, described below.

Organic EL Display

There is no particular limitation on the organic EL display of the present invention, and the construction may be conventional, except that the organic EL element according to the present invention is included.

The organic EL display may be a monochrome, multi-color, or full color type.

The organic EL display may be made a full color type using several methods including those disclosed in "Monthly Display (published by Techno Times Co., Ltd. of Japan)", September 2000, pages 33-37, i.e., (a) the three color light emitting method in which three types of organic EL elements which, respectively, emit light corresponding to the three primary colors (blue (B), green (G), red (R)) are disposed on a substrate; (b) the white light method in which white light from an organic EL element for white light emission is divided into the three primary colors via color filters; (c) and the color conversion method in which blue light emitted by an organic EL element which emits blue light is converted into red (R) and green (G) via a fluorescent pigment layer. In the present invention, as the organic EL element of the invention emits red light, the three color light emitting method and color conversion method can be used, the three color light emitting method being particularly suitable.

In manufacturing an organic EL display of the full color type by the three color light emitting method, an organic EL element for red light emission, and an organic EL element for green light emission, and an organic EL element for blue light emission are required.

The organic EL element for red light emission may be selected from among those known in the art; suitable laminar constructions is ITO (positive electrode)/NPD aforesaid/ DCJTB 1% aluminum quinoline complex (Alq)/Alq aforesaid/Al—Li (negative electrode), for example. DCJTB is 4-dicyanomethylene-6-cp -julolidinostyryl-2-tert-butyl-4H-pyran.

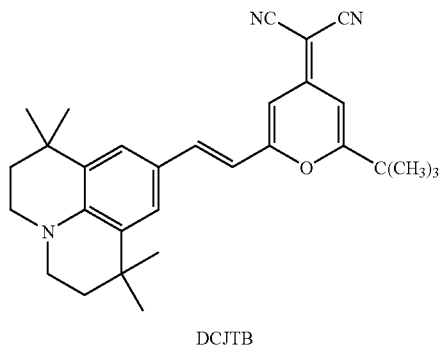

DCJTB

The organic EL element for green light emission may be selected from among those known in the art; suitable laminar constructions is ITO (positive electrode)/NPD aforesaid/ dimethyl quinacridone 1% Alq aforesaid/Alq aforesaid/Al— Li (negative electrode), for example.

The organic EL element for blue light emission may be selected from among those known in the art; suitable laminar constructions is ITO (positive electrode)/NPD aforesaid/ DPVBi aforesaid/Alq aforesaid/Al—Li (negative electrode), for example.

The aspect of organic EL display may be properly selected depending on the application. Examples thereof include a passive matrix panel and active matrix panel disclosed in Nikkei Electronics (published by Nikkei Business Publications Inc. of Japan), No. 765, Mar. 13, 2000, pages 55-62.

Figure 3:
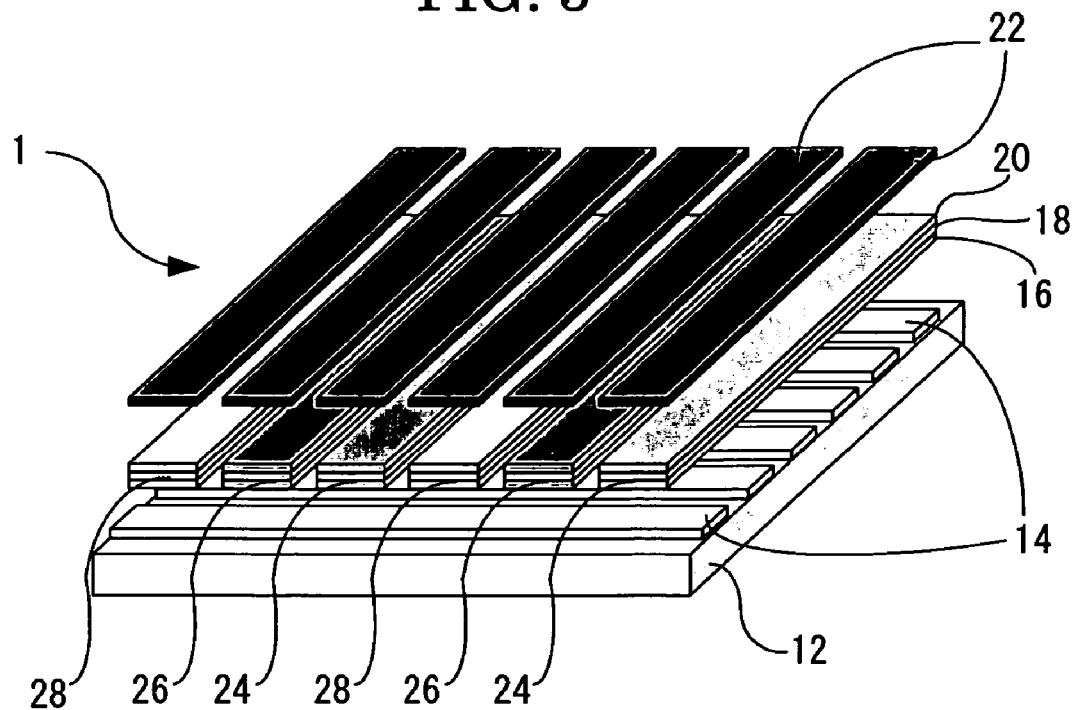
FIG. 3 is an exemplary schematic view that explains a construction of an organic EL display of passive matrix type or passive matrix panel.

The passive matrix panel for example has belt-like positive electrodes 14 such as an ITO electrode arranged parallel to each other on a glass substrate 12 as shown in FIG. 3. On the positive electrodes 14, belt-like organic thin film layers 24 for red light emission, organic thin film layers 26 for blue light emission and organic thin film layers 28 for green light emission are arranged sequentially in parallel and substantially perpendicular to the positive electrodes 14. Each of the organic thin film layers has negative electrodes 22 of identical shape thereon.

Figure 4:
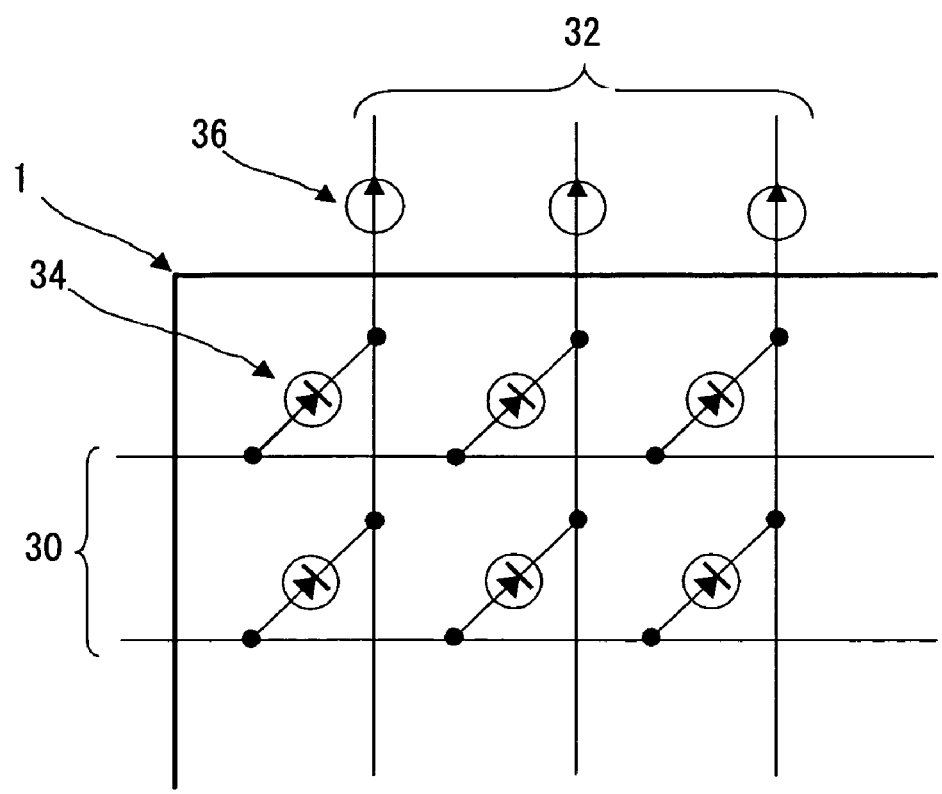
FIG. 4 is a schematic view that explains the circuit of the organic EL display or passive matrix panel shown in FIG. 3.

In the passive matrix panel, positive electrode lines 30 comprising a plurality of positive electrodes 14, and negative electrode lines 32 comprising a plurality of negative electrodes 22, for example intersect substantially at right angles to form a circuit, as shown in FIG. 4. Each of the organic thin film layers 24, 26, and 28 for red light emission, blue light emission and green light emission situated at each intersection point functions as a pixel, there being a plurality of organic EL elements 34 corresponding to each pixel. In this passive matrix panel, when a current is applied by constant-current supply 36 to one of the positive electrodes 14 in the positive electrode lines 30, and one of the negative electrodes 22 in the negative electrode lines 32, a current will be applied to an organic EL thin film layer situated at the intersection, and the organic EL thin film layer at this position will emit light. By controlling the light emission of each pixel unit, a full color picture can easily be formed.

Figure 5:
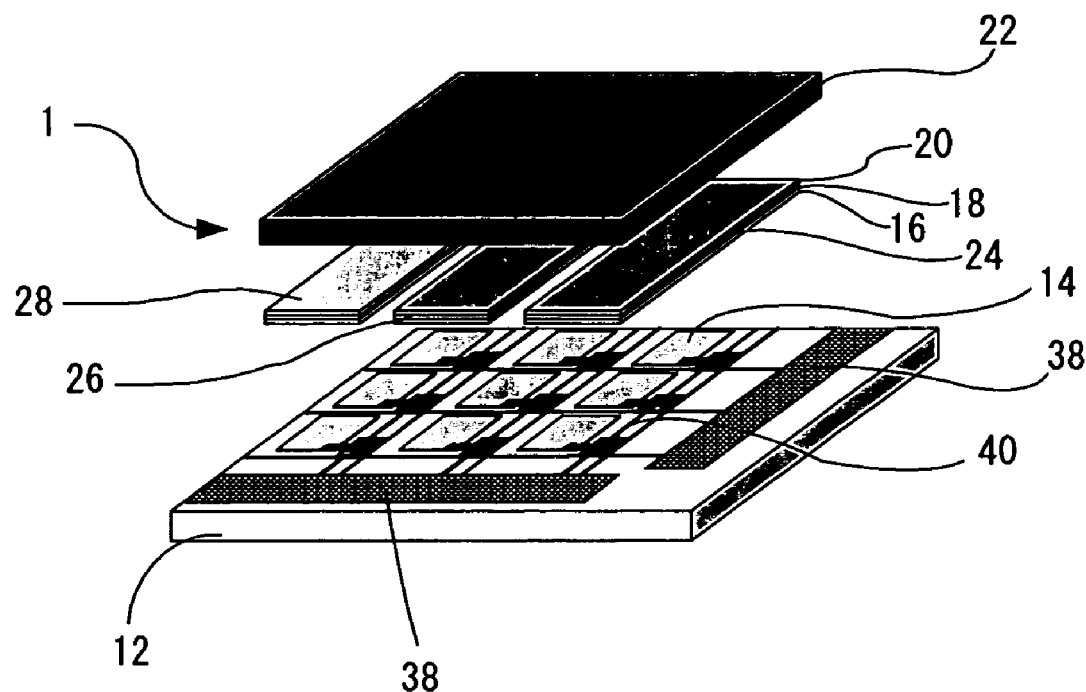
FIG. 5 is an exemplary schematic view that explains a construction of an organic EL display of active matrix type or active matrix panel.

In the active matrix panel, for example, scanning lines, data lines and current supply lines are arranged in a grid pattern on glass substrate 12, as shown in FIG. 5. TFT circuit 40 connected to the scanning lines and the like forming the grid pattern is disposed in each grid, and positive electrode 14 (for example, an ITO electrode) disposed in each grid can be driven by the TFT circuit 40. On the positive electrodes 14, belt-like organic thin film layer 24 for red light emission, organic thin film layer 26 for blue light emission and organic thin film layer 28 for green light emission, are arranged sequentially and in parallel to each other. Negative electrode 22 is further arranged so as to cover each of the organic thin film layer 24 for red light emission, organic thin film layer 26 for blue light emission and organic thin film layer 28 for green light emission. The organic thin film layer 24 for red light emission, organic thin film layer 26 for blue light emission and organic thin film layer 28 for green light emission respectively comprise positive hole transporting layer 16, light emitting layer 18 and electron transporting layer 20.

Figure 6:
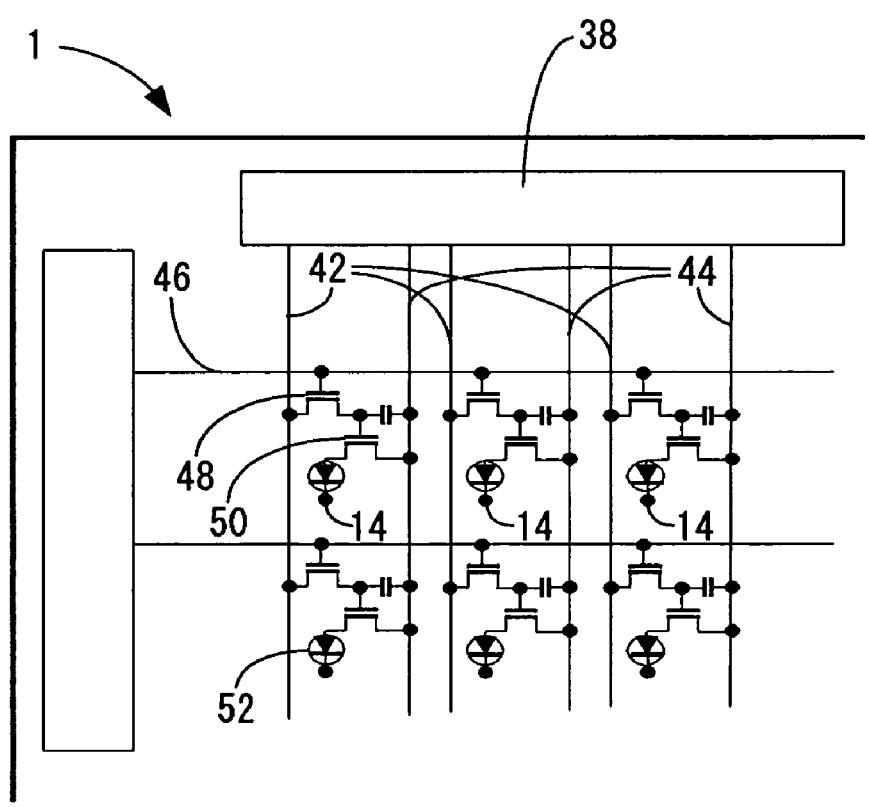
FIG. 6 is a schematic view that explains the circuit of the organic EL display or active matrix panel shown in FIG. 5.

In the active matrix panel, as shown in FIG. 6, a plurality of scanning lines 46 are arranged in parallel to each other intersecting in substantially right angles with a plurality of data lines 42 and current supply lines 44, which are parallel to each other, to form grids, and switching TFT 48 and driver TFT 50 are connected to each grid to form a circuit. When a current is applied from a driver circuit 38, the switching TFT 48 and driver TFT 50 can be driven for each grid. In each grid, the organic thin film elements 24, 26, and 28 for blue light emission, green light emission and red light emission function as a pixel. In this active matrix panel, when a current is applied from the driver circuit 38 to one of the scanning lines 46 arranged in the horizontal direction, and the current supply lines 44 arranged in the vertical direction, the switching TFT 48 situated at the intersection is driven, the driver TFT 50 is driven as a result, and an organic EL element 52 at this position emits light. By controlling the light emission of each pixel unit, a full color picture can easily be formed.

The organic EL display of the present invention may be conveniently used in fields of various kinds such as computers, vehicle-mounted display devices, field-ready display devices, home apparatuses, industrial apparatuses, household electric appliances, traffic display devices, clock display devices, calendar display units, luminescent screens, and audio equipment.

Hereinafter, specific examples of the present invention will be described, but it should be understood that the present invention is not limited to these examples.

EXAMPLE 1

Manufacture of Organic EL Element

A glass substrate equipped with an ITO electrode was prepared as a positive electrode. The ITO electrode was subjected to ultrasonic cleaning in water, acetone, and isopropyl alcohol, then was subjected to UV ozone treatment.

An amine salt compound of perfluoropolyether (PFPE) expressed by the formula below (weight-averaged molecular weight: 4000, by SONY) was employed as a material for positive hole injecting layer. The amine salt compound was dissolved into a solvent (FC77, by 3M) to prepare a solution of coating liquid for positive hole transporting layer that contained 0.023% by mass of the amine salt compound. Then the positive electrode was dipped in the solution of coating liquid and pulled up in a raise rate of 100 mm/min thereby to form a positive hole injecting layer of 0.8 nm thick on the ITO.

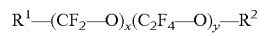

in the above formula, x=20 or less, y=20 or less, y/x=1; $R^1$ and $R^2$ are represented by the following formula.

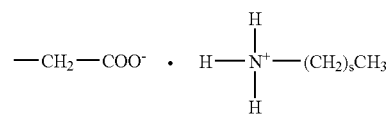

in which, in the above formula, S=5.

Then, alpha-NPD(N,N'-di(1-naphthyl)-N,N'-diphenyl-[1,1'-biphenyl]-4,4'-diamine) was employed as a positive hole transporting material, and was vapor deposited on the positive hole injecting layer by means of a vacuum vapor deposition apparatus in conditions that vacuum level was $1.3 \times 10^{-4}$ Pa, the substrate temperature was room temperature, and the vapor deposition rate was 0.1 nm/sec, thereby to form a positive hole transporting layer of 50 nm thick.

Then, tris(8-hydroxyquinolio)aluminum (Alq3) was vapor deposited on the positive hole transporting layer at a vapor deposition rate of 0.1 nm/sec to form a layer of 50 nm thick that performs as a light emitting layer and as an electron transporting layer.

Thereafter, Al—Li alloy (Li content: 0.5% by mass) was vapor deposited on the light emitting layer and electron transporting layer at a vapor deposition rate of 0.2 nm/sec to form a negative electrode of 50 nm thick.

As a result, an organic EL element of laminated type was manufactured as shown in FIG. 2.

Further, in the organic EL element of Example 1, the thickness of the positive hole injecting layer, formed of an amine compound of perfluoropolyether (PFPE), was varied and the ionization potential was measured by means of an ionization potential measuring apparatus (AC-1, by Riken Keiki Co., Ltd.). The results were shown in FIG. 7.

The results of FIG. 7 demonstrates that the ionization potential of the positive hole injecting layer are within about 5.23 to 5.44 eV, although the values depend on the thickness of the positive hole injecting layer.

In addition, respective ionization potentials of the positive electrode, positive hole injecting layer, positive hole transporting layer, light emitting layer and electron transporting layer, and negative electrode were measured with respect to the organic EL element of Example 1 by means of the ionization potential measuring apparatus (AC-1, by Riken Keiki Co., Ltd.). The results were shown in FIG. 8.

Figure 8:
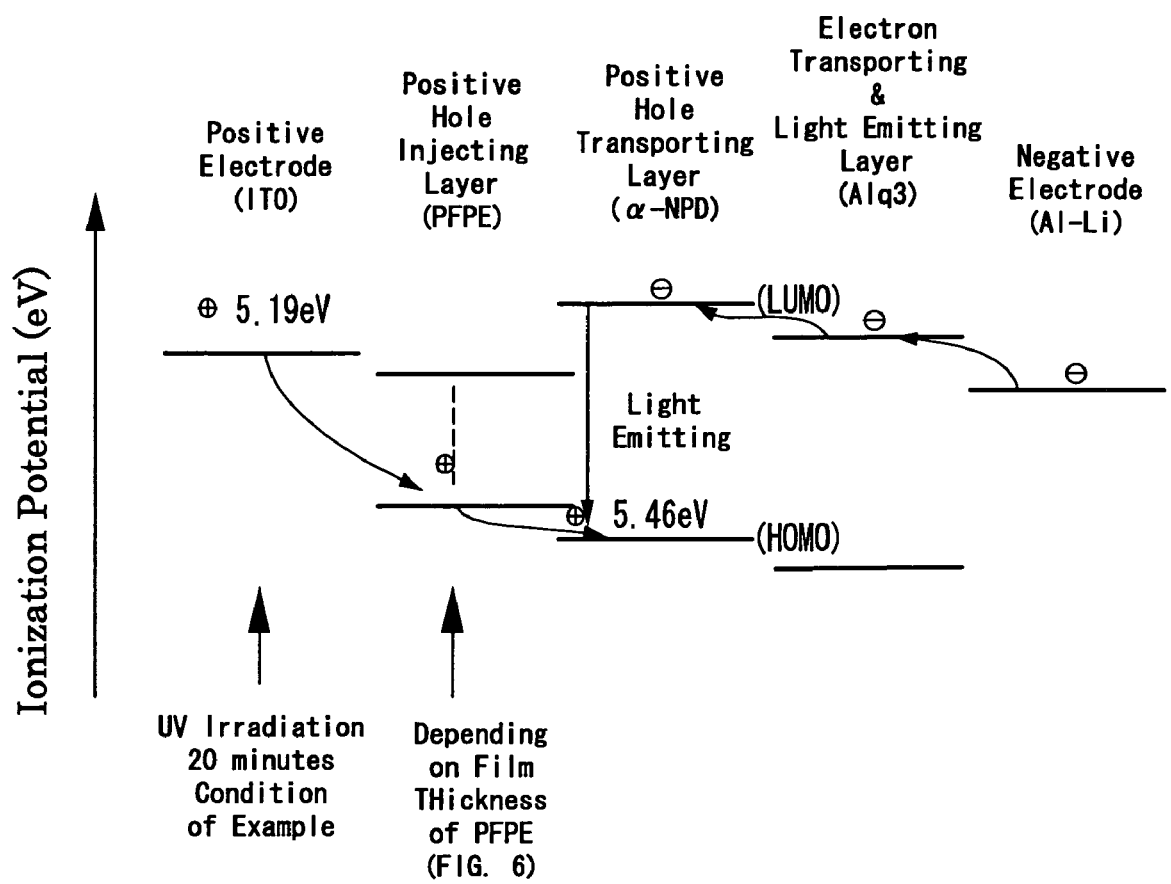
FIG. 8 is an exemplary schematic view that shows a relation between ionization potentials at respective layers of an organic EL element according to the present invention.

The results of FIG. 8 demonstrate that the ionization potential of the positive hole injecting layer or PFPE layer exists at the site between the ionization potential of the positive electrode and the ionization potential of the positive hole transporting layer at the highest occupied molecular orbital (HOMO).

COMPARATIVE EXAMPLE 1

Figure 9:
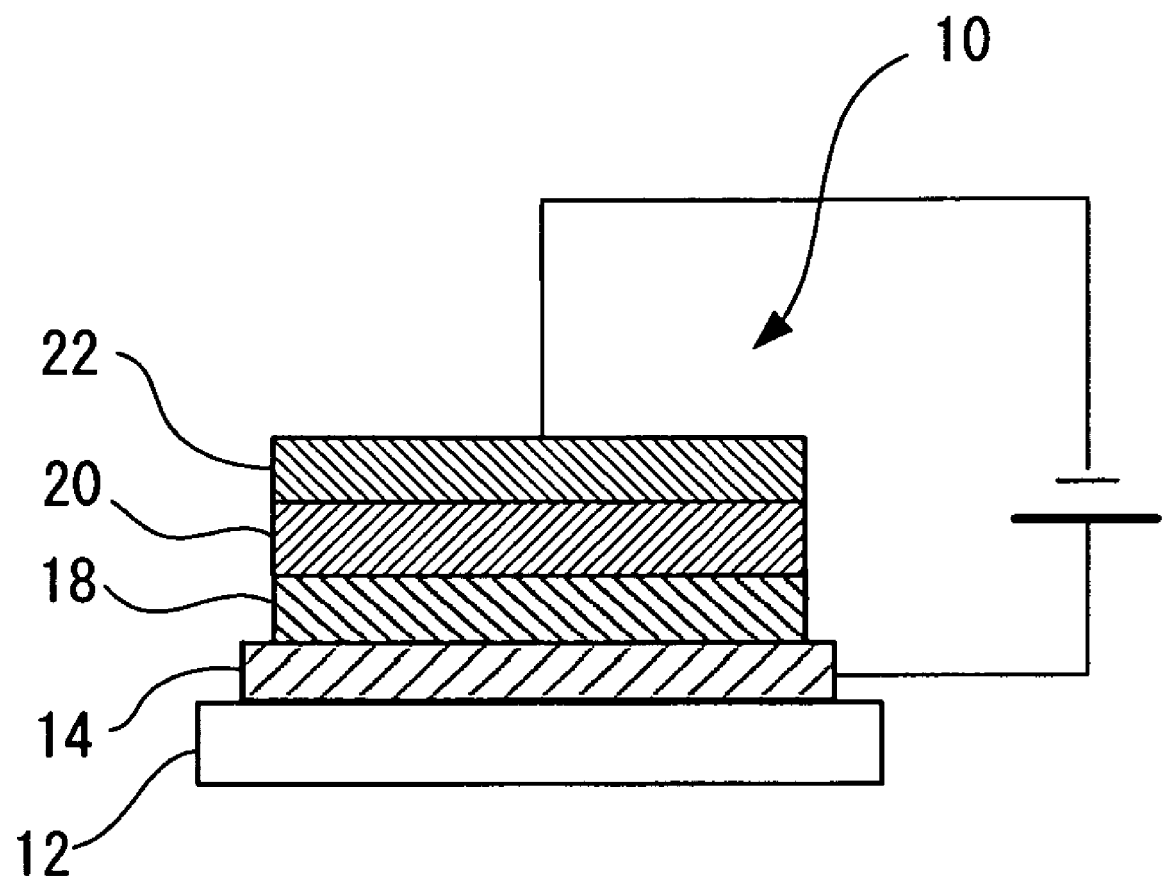
FIG. 9 is an exemplary schematic view that explains a layer construction of an organic EL element of Comparative Example 1.

An organic EL element was manufactured in the same manner as Example 1, except that the positive hole injecting layer was not formed as shown in FIG. 9.

Measurement of Emission Luminance

Figure 10:
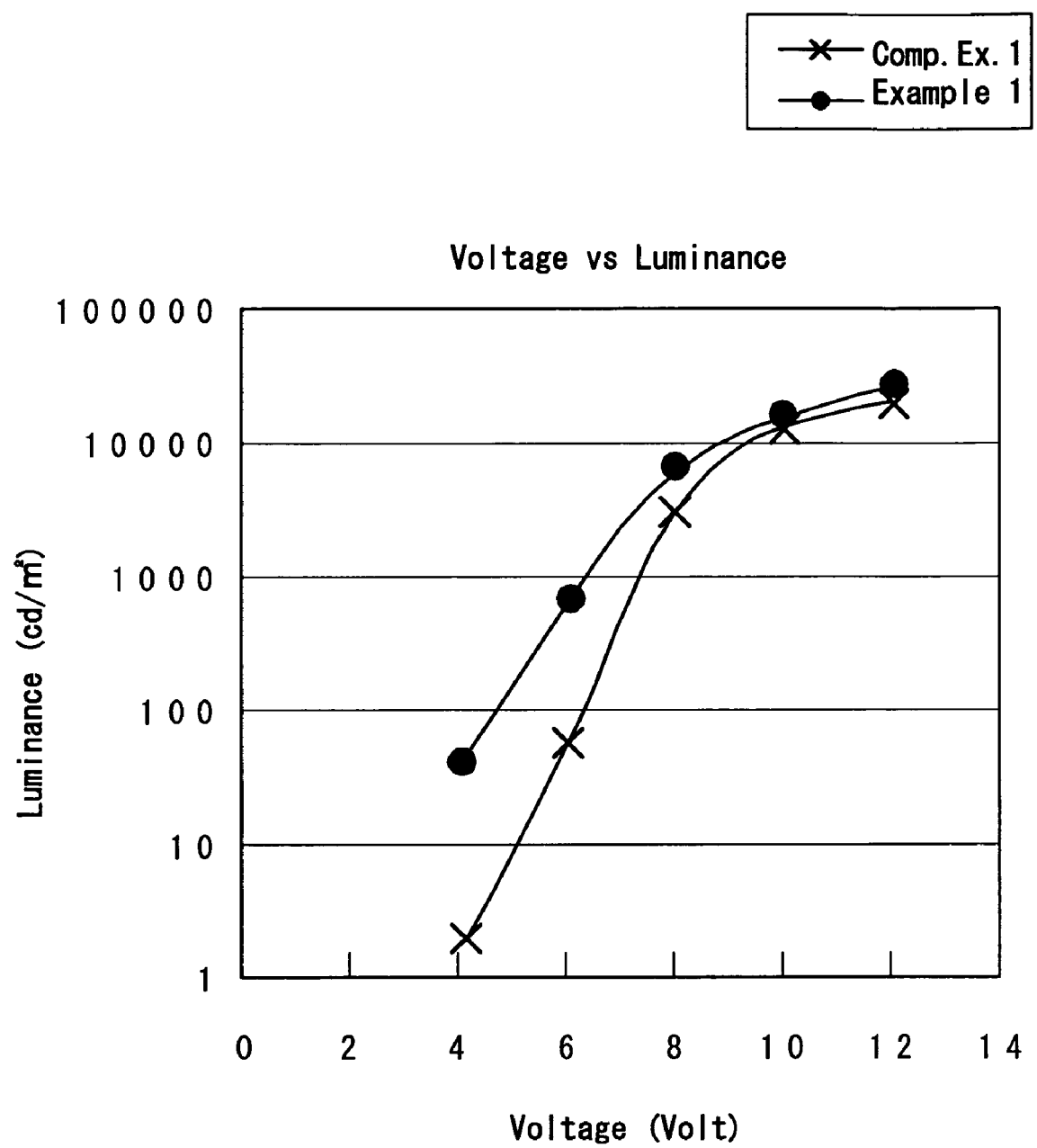
FIG. 10 is a graph that shows a relation between voltages and emitting luminance of the respective organic EL elements of Example 1 and Comparative Example 1.
Figure 11:
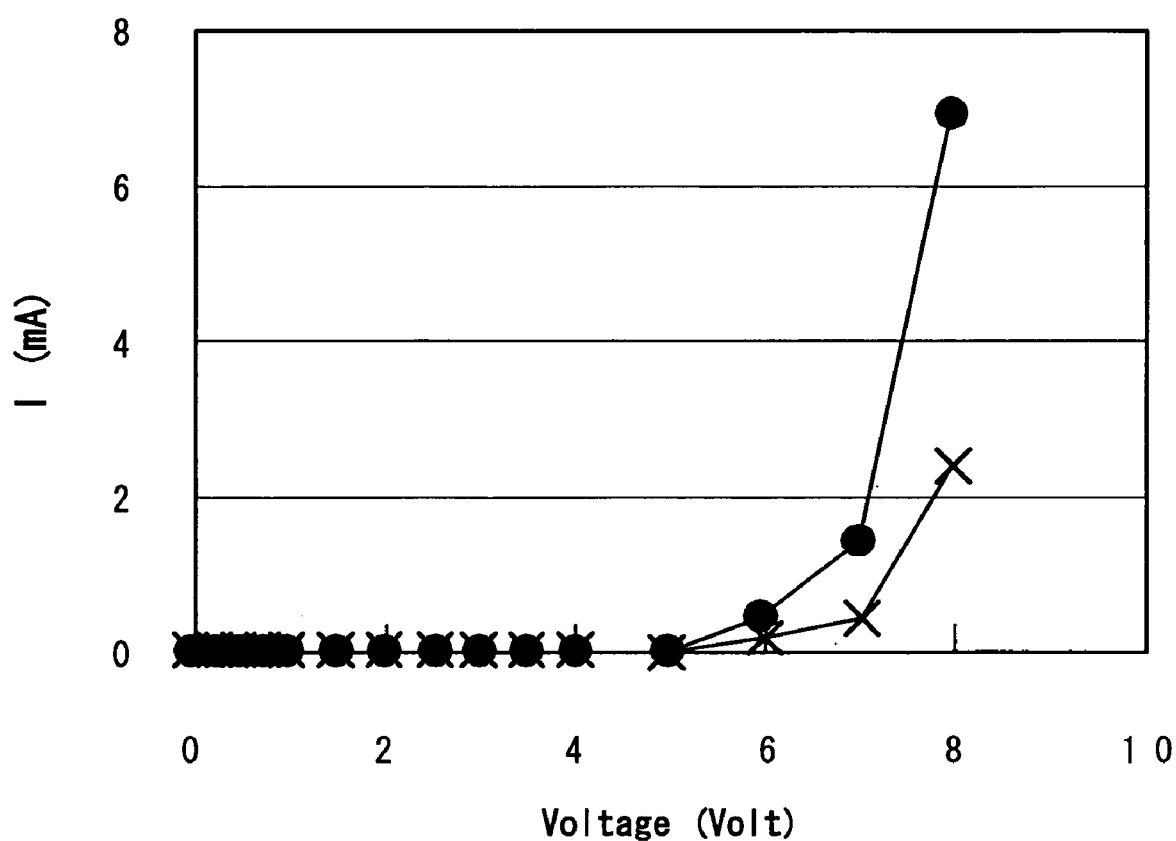
FIG. 11 is a graph that shows relations between positive voltage and current of the respective organic EL elements of Example 1 and Comparative Example 1.

As for the organic EL elements of Example 1 and Comparative Example 1, a voltage was applied between the ITO electrode or positive electrode and the Al—Li alloy or negative electrode. Consequently, green luminance was observed for the organic EL elements of Example 1 and Comparative Example 1 respectively, at the voltage of 4 Volts or more as shown in FIG. 10; and it is demonstrated that the organic EL element of Example 1 displays higher emission luminance compared to the organic EL element of Comparative Example 1 at the same voltage, in particular the organic EL element of Example 1 displays superior emission luminance at lower voltages of 4 to 8 Volts. The reason is considered that the energy barrier is lower for injecting positive holes from the positive holes to the organic thin layer, thereby current appropriately flows for the positive voltage thus to increase the luminous efficiency.

Evaluation of Diode Property

Figure 12:
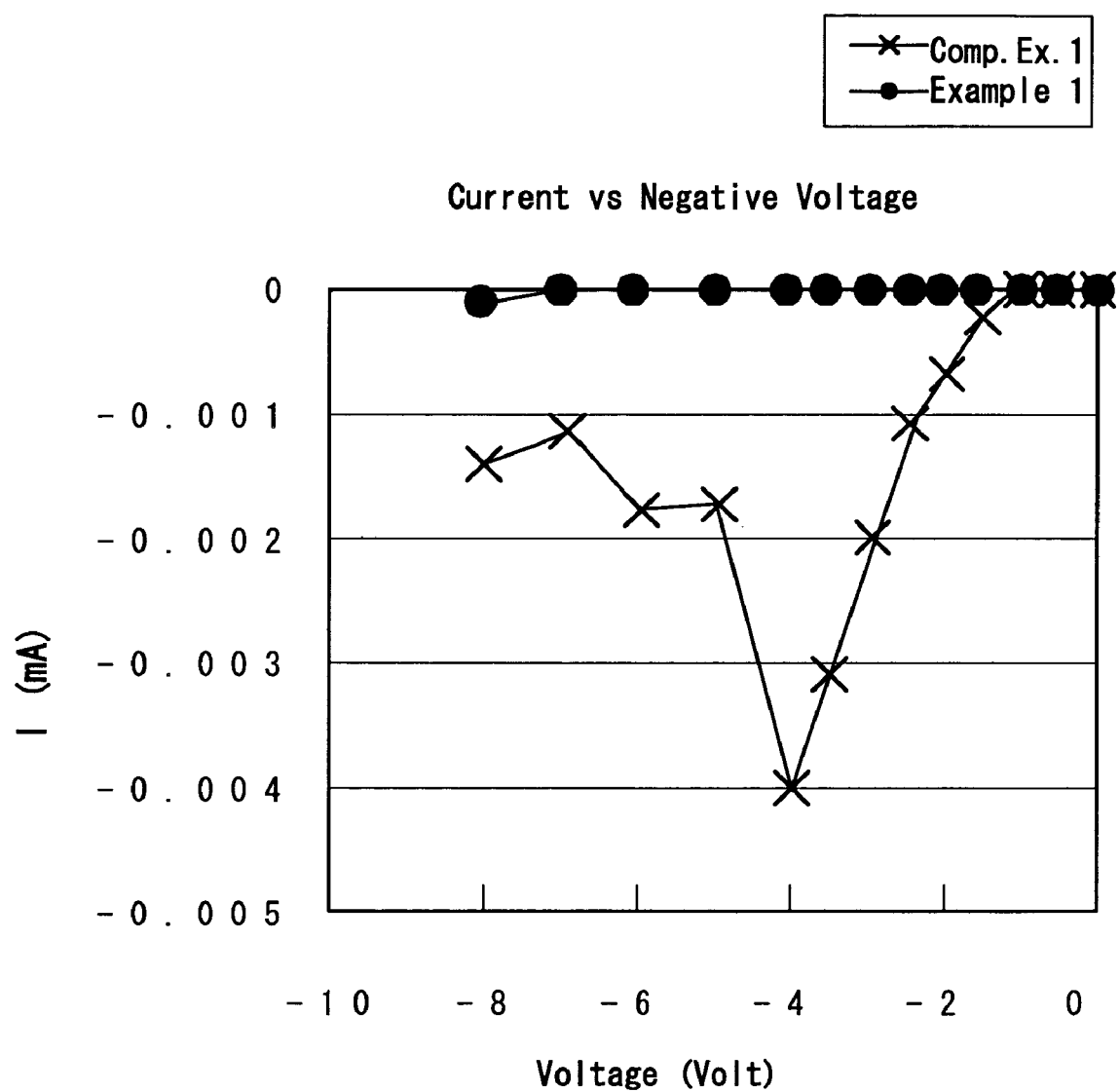
FIG. 12 is a graph that shows relations between negative voltage and current of the respective organic EL elements of Example 1 and Comparative Example 1.

As for the organic EL elements of Example 1 and Comparative Example 1, the relations between the applied voltages and the resultant currents were examined and the following results were obtained. In the case of organic EL element of Example 1, the current was higher compared to the organic EL element of Comparative Example 1 at positive voltages, demonstrating superior positive hole transporting property; further, current does not flows at negative voltages as shown in FIG. 12, demonstrating superior diode property. On the other hand, in the case of organic EL element of Comparative Example 1, the current was lower compared to the organic EL element of Example 1 at positive voltages at positive voltages, demonstrating inferior positive hole transporting property; further, current did flow at negative voltages as shown in FIG. 12, demonstrating inferior diode property.

Evaluation of Crosstalk Occurrence

An organic EL display was manufactured using the organic EL element of Example 1, and the organic EL display did not occur crosstalk and displayed clear images. On the other hand, an organic EL display or organic EL panel was manufactured using the organic EL element of Comparative Example 1, and the organic EL display did occur crosstalk and did not display clear images. The reason is considered that the difference as to the diode properties caused such difference on performance.

INDUSTRIAL APPLICABILITY

In accordance with the present invention, materials for positive hole injecting layers that are able to increase the amount of injected positive holes; highly reliable organic EL elements that are able to provide higher luminance with lower voltage and exhibit lower leak current at negative biases and appropriate diode properties; and higher performance organic EL displays that utilize the organic EL elements can be provided.

What is claimed is:

1. An organic EL element comprising an organic thin film layer between a positive electrode and a negative electrode,
    wherein the organic thin film layer comprises:
    a positive hole injecting layer,
    a positive hole transporting layer, and
    a light emitting layer,
    wherein a perfluoropolyether compound is incorporated into the positive hole injecting layer.

2. The organic EL element according to claim 1, wherein the perfluoropolyether skeleton in the perfluoropolyether compound is partially hydrogenated.

3. The organic EL element according to claim 1, wherein the perfluoropolyether compound is an amine salt of perfluoropolyether.

4. The organic EL element according to claim 1, wherein the perfluoropolyether compound is expressed by one of formulas (1) and (2),

$$R^1-Rf-R^2 \qquad \text{formula (1)}$$

$$Rf-R^3 \qquad \text{formula (2)}$$

in which, $R^1$, $R^2$, and $R^3$ in the formulas (1) and (2) may be identical or different from each other, and each represents one of a hydrogen atom, a fluorine atom, and a substituted group; Rf represents the perfluoropolyether skeleton expressed by the formula (3),

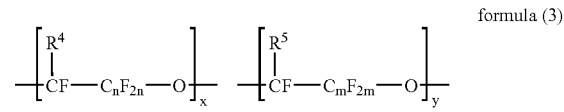

$$\left[\begin{array}{c} R^4 \\ | \\ CF-C_nF_{2n}-O \end{array}\right]_x \left[\begin{array}{c} R^5 \\ | \\ CF-C_mF_{2m}-O \end{array}\right]_y \qquad \text{formula (3)}$$

in which, $R^4$ and $R^5$ in the formula (3) may be identical or different each other, and each represents general formula $-C_pF_{2p+1}$ ("p" is an integer of 0 or more); "n" and "m" may be identical or different from each other, and are each an integer of 0 or more, "x" and "y" may be identical or different from each other, and are each an integer of 1 or more.

5. The organic EL element according to claim 4, wherein the $R^1$ to $R^3$ in the formulas (1) and (2) are each selected from the group consisting of alkyl groups, aralkyl groups, alkenyl groups, aryl groups, cyano groups, amino groups, acyl groups, alkoxy carbonyl groups, carboxyl group, alkoxy groups, alkyl sulfonyl groups, hydroxyl group, amide groups, aryloxy groups, aromatic hydrocarbon ring groups, aromatic heterocyclic groups, and groups expressed by formula (4),

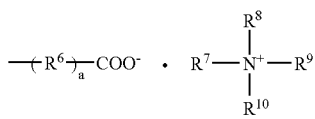

formula (4)

in which, in the formula (4), $R^6$ represents a hydrocarbon group; "a" represents an integer of 0 or more; $R^7$ to $R^{10}$ may be identical or different from each other, and each represents one of a hydrogen atom, a fluorine atom, and hydrocarbon groups.

6. The organic EL element according to claim 1, wherein the weight-averaged molecular weight of the perfluoropolyether compound is 500 to 10000.

7. The organic EL element according to claim 1, wherein the thickness of the positive hole injecting layer is 0.1 to 10 nm thick.

8. The organic EL element according to claim 1, wherein the organic thin film layer comprises a positive hole injecting layer, a positive hole transporting layer, and a light emitting layer in turn from the side of the positive electrode, the ionization potential in the positive hole injecting layer is lower than the ionization potential in the positive electrode and higher than the ionization potential in the positive hole transporting layer at the highest occupied molecular orbital (HOMO).

9. The organic EL element according to claim 8, wherein the ionization potential in the positive hole injecting layer is 4.8 to 5.6 eV.

10. An organic EL display comprising an organic EL element,
wherein the organic EL element comprises an organic thin film layer between a positive electrode and a negative electrode,
wherein the organic thin film layer comprises:
a positive hole injecting layer,
a positive hole transporting layer, and
a light emitting layer,
wherein a perfluoropolyether compound is incorporated into the positive hole injecting layer.

11. The organic EL display according to claim 10, wherein the organic EL display is formed into one of a passive matrix panel and an active matrix panel.

* * * * *